(12) United States Patent
Wallace et al.

(10) Patent No.: US 8,323,410 B2
(45) Date of Patent: *Dec. 4, 2012

(54) HIGH THROUGHPUT CHEMICAL TREATMENT SYSTEM AND METHOD OF OPERATING

(75) Inventors: Jay R. Wallace, Danvers, MA (US); Hiroyuki Takahashi, North Andover, MA (US)

(73) Assignee: Tokyo Electron Limited, Tokyo (JP)

( * ) Notice: Subject to any disclaimer, the term of this patent is extended or adjusted under 35 U.S.C. 154(b) by 1025 days.

This patent is subject to a terminal disclaimer.

(21) Appl. No.: 12/183,650

(22) Filed: Jul. 31, 2008

(65) Prior Publication Data

US 2010/0025367 A1    Feb. 4, 2010

(51) Int. Cl.
  *C23F 1/08* (2006.01)
  *B08B 7/00* (2006.01)
(52) U.S. Cl. .............. 118/724; 156/345.53; 156/345.27; 134/56 R
(58) Field of Classification Search ........ 156/345.51–345.53, 345.33; 118/724, 118/725
See application file for complete search history.

(56) References Cited

U.S. PATENT DOCUMENTS

| | | | |
|---|---|---|---|
| 4,492,610 A | 1/1985 | Okano et al. | |
| 4,838,978 A | 6/1989 | Sekine et al. | |
| 5,240,556 A | 8/1993 | Ishikawa et al. | |
| 5,273,588 A | 12/1993 | Foster et al. | |
| 5,282,925 A | 2/1994 | Jeng et al. | |
| 5,567,267 A | 10/1996 | Kazama et al. | |
| 5,769,952 A | 6/1998 | Komino | |
| 5,838,055 A | 11/1998 | Kleinhenz et al. | |
| 5,876,879 A | 3/1999 | Kleinhenz et al. | |
| 6,071,815 A | 6/2000 | Kleinhenz et al. | |
| 6,074,951 A | 6/2000 | Kleinhenz et al. | |
| 6,099,651 A | 8/2000 | Sajoto et al. | |
| 6,165,271 A | 12/2000 | Zhao et al. | |
| 6,245,619 B1 | 6/2001 | Boyd et al. | |
| 6,258,170 B1 | 7/2001 | Somekh et al. | |
| 6,271,094 B1 | 8/2001 | Boyd et al. | |
| 6,284,006 B1 | 9/2001 | Siefering et al. | |
| 6,335,261 B1 | 1/2002 | Natzle et al. | |
| 6,527,865 B1 | 3/2003 | Sajoto et al. | |
| 6,530,993 B2 | 3/2003 | Hwang et al. | |
| 6,951,821 B2 | 10/2005 | Hamelin et al. | |
| 7,029,536 B2 | 4/2006 | Hamelin et al. | |
| 7,079,760 B2 | 7/2006 | Hamelin et al. | |
| 7,214,274 B2 | 5/2007 | Wallace et al. | |
| 7,235,137 B2 * | 6/2007 | Kitayama et al. | 118/724 |
| 7,241,362 B2 * | 7/2007 | Shimbara et al. | 156/345.55 |
| 7,462,564 B2 | 12/2008 | Hamelin et al. | |
| 7,964,058 B2 | 6/2011 | Hamelin et al. | |
| 2001/0016226 A1 | 8/2001 | Natzle et al. | |
| 2002/0002947 A1 | 1/2002 | Satoyoshi et al. | |
| 2002/0011216 A1 | 1/2002 | Nguyen et al. | |
| 2002/0015855 A1 | 2/2002 | Sajoto et al. | |
| 2002/0028555 A1 | 3/2002 | Boyd et al. | |

(Continued)

OTHER PUBLICATIONS

International Searching Authority, International Search Report and Written Opinion, International Application No. PCT/US09/50401, Mailed Aug. 24, 2009, 16 pages.

(Continued)

*Primary Examiner* — Sylvia R. MacArthur

(57) ABSTRACT

A high throughput chemical treatment system for processing a plurality of substrates is described. The chemical treatment system is configured to chemically treat a plurality of substrates in a dry, non-plasma environment.

20 Claims, 21 Drawing Sheets

U.S. PATENT DOCUMENTS

| | | |
|---|---|---|
| 2002/0043216 A1 | 4/2002 | Hwang et al. |
| 2002/0056417 A1 | 5/2002 | Yonemizu et al. |
| 2002/0063110 A1 | 5/2002 | Cantell et al. |
| 2002/0189757 A1 | 12/2002 | Denton et al. |
| 2002/0195201 A1 | 12/2002 | Beer et al. |
| 2004/0020601 A1 | 2/2004 | Zhao et al. |
| 2004/0182315 A1 | 9/2004 | Laflamme et al. |
| 2004/0185583 A1 | 9/2004 | Tomoyasu et al. |
| 2004/0185670 A1 | 9/2004 | Hamelin et al. |
| 2005/0218113 A1 | 10/2005 | Yue et al. |
| 2005/0218114 A1 | 10/2005 | Yue et al. |
| 2005/0227494 A1 | 10/2005 | Higuchi et al. |
| 2006/0134919 A1 | 6/2006 | Hamelin et al. |
| 2007/0238301 A1 | 10/2007 | Cabral et al. |
| 2007/0298972 A1 | 12/2007 | Kent et al. |
| 2008/0217293 A1 | 9/2008 | Iimuro |
| 2010/0024981 A1 | 2/2010 | Wallace et al. |
| 2010/0024982 A1 | 2/2010 | Wallace et al. |
| 2010/0025368 A1 | 2/2010 | Hamelin et al. |
| 2010/0025389 A1 | 2/2010 | Launsby et al. |
| 2011/0204029 A1 | 8/2011 | Hamelin et al. |

OTHER PUBLICATIONS

U.S. Office Action issued in U.S. Appl. No. 12/183,694 mailed Nov. 29, 2010.

U.S. Office Action issued in U.S. Appl. No. 12/183,694 mailed May 12, 2011.

U.S. Office Action issued in U.S. Appl. No. 12/183,763 mailed Oct. 13, 2011.

U.S. Office Action issued in U.S. Appl. No. 12/183,828 mailed Dec. 27, 2010.

U.S. Office Action issued in U.S. Appl. No. 12/183,828 mailed Jun. 9, 2011.

U.S. Office Actions issued in U.S. Appl. No. 11/682,625 mailed Sep. 29, 2009, Feb. 26, 2010, and May 10, 2010.

U.S. Office Action issued in U.S. Appl. No. 12/183,763 mailed Apr. 10, 2012.

* cited by examiner

US 8,323,410 B2

HIGH THROUGHPUT CHEMICAL TREATMENT SYSTEM AND METHOD OF OPERATING

CROSS-REFERENCE TO RELATED APPLICATIONS

This application is related to pending U.S. patent application Ser. No. 11/682,625, entitled "PROCESSING SYSTEM AND METHOD FOR PERFORMING HIGH THROUGHPUT NON-PLASMA PROCESSING", filed on Mar. 6, 2007; co-pending U.S. patent application Ser. No. 12/183,597, entitled "HEATER ASSEMBLY FOR HIGH THROUGHPUT CHEMICAL TREATMENT SYSTEM", filed on even date herewith; co-pending U.S. patent application Ser. No. 12/183,694, entitled "SUBSTRATE SUPPORT FOR HIGH THROUGHPUT CHEMICAL TREATMENT SYSTEM", filed on even date herewith; co-pending U.S. patent application Ser. No. 12/183,763, entitled "HIGH THROUGHPUT THERMAL TREATMENT SYSTEM AND METHOD OF OPERATING", filed on even date herewith; and co-pending U.S. patent application Ser. No. 12/183,828, entitled "HIGH THROUGHPUT PROCESSING SYSTEM FOR CHEMICAL AND THERMAL TREATMENT AND METHOD OF OPERATING", filed on even date herewith. The entire contents of these applications are herein incorporated by reference in their entirety.

BACKGROUND OF THE INVENTION

1. Field of the Invention

The invention relates to a chemical treatment system and, more particularly, to a high throughput chemical treatment system.

2. Description of Related Art

In material processing methodologies, various processes are utilized to remove material from the surface of a substrate, including for instance etching processes, cleaning processes, etc. During pattern etching, fine features, such as trenches, vias, contact vias, etc., are formed in the surface layers of the substrate. For example, pattern etching comprises the application of a thin layer of radiation-sensitive material, such as photo-resist, to an upper surface of a substrate. A pattern is formed in the layer of radiation-sensitive material using a lithographic technique, and this pattern is transferred to the underlying layers using a dry etching process or series of dry etching processes.

Additionally, multi-layer masks, comprising a layer of radiation-sensitive material and one or more soft mask layers and/or hard mask layers, may be implemented for etching features in the thin film. For example, when etching features in the thin film using a hard mask, the mask pattern in the radiation-sensitive layer is transferred to the hard mask layer using a separate etch step preceding the main etch step for the thin film. The hard mask may, for example, be selected from several materials for silicon processing including silicon dioxide ($SiO_2$), silicon nitride ($Si_3N_4$), and carbon. Furthermore, in order to reduce the feature size formed in the thin film, the hard mask layer may be trimmed laterally. Thereafter, one or more of the mask layers and/or any residue accumulated on the substrate during processing may be removed using a dry cleaning process before or after the pattern transfer to the underlying layers. One or more of the pattern forming, trimming, etching, or cleaning process steps may utilize a dry, non-plasma process for removing material from the substrate. For example, the dry, non-plasma process may comprise a chemical removal process that includes a two-step process involving a chemical treatment of the exposed surfaces of the substrate in order to alter the surface chemistry of these exposed surface layers, and a post treatment of the chemically altered exposed surfaces in order to desorb the altered surface chemistry. Although the chemical removal process exhibits very high selectivity for the removal of one material relative to another material, this process suffers from low throughput thus making the process less practical.

Etch processing is normally performed using a single substrate processing cluster tool, comprising a substrate transfer station, one or more process modules, and a substrate handling system configured to load and unload a single substrate into and out of each of the one or more process modules. The single substrate configuration allows one substrate to be processed per chamber in a manner that provides consistent and repeatable process characteristics both within-substrate and from substrate-to-substrate. While the cluster tool provides the characteristics necessary for processing various features on a substrate, it would be an advance in the art of semiconductor processing to increase the throughput of a process module while providing necessary process characteristics.

SUMMARY OF THE INVENTION

The invention relates to a chemical treatment system and, more particularly, to a high throughput chemical treatment system.

Furthermore, the invention relates to a high throughput chemical treatment system for processing a plurality of substrates. The chemical treatment system is configured to chemically treat a plurality of substrates in a dry, non-plasma environment.

According to an embodiment, a processing system for chemically treating a plurality of substrates is described, comprising: a chemical treatment chamber; a temperature controlled substrate holder mounted within the chemical treatment chamber and configured to support two or more substrates on a support surface thereof; a gas injection assembly coupled to the chemical treatment chamber and configured to introduce one or more process gases to a process space in the chemical treatment chamber in order to chemically alter exposed surface layers on the two or more substrates; a heater assembly coupled to the gas injection assembly and configured to elevate a temperature of the gas injection assembly; and a vacuum pumping system coupled to the chemical treatment chamber.

According to another embodiment, a method of operating a processing system to chemically treat a substrate is described, comprising: transferring two or more substrates into a chemical treatment system comprising a chemical treatment chamber, a temperature controlled substrate holder mounted within the chemical treatment chamber and configured to support two or more substrates on a support surface thereof, a gas injection assembly coupled to the chemical treatment chamber and configured to introduce one or more process gases to a process space in the chemical treatment chamber in order to chemically alter exposed surface layers on the two or more substrates, a heater assembly coupled to the gas injection assembly and configured to elevate a temperature of the gas injection assembly, a vacuum pumping system, and a controller coupled to the thermal treatment system; setting chemical processing parameters for the chemical treatment system using the controller, wherein the one or more chemical processing parameters comprise at least one of a chemical treatment processing pressure, a chemical treatment chamber temperature, a chemical treatment upper assembly temperature, a flow rate of the one or more process gases, a chemical treatment substrate temperature, and a chemical treatment substrate holder temperature; and processing the two or more substrates in the chemical treatment system using the chemical processing parameters in order to chemically alter exposed surface layers on the two or more substrates.

DETAILED DESCRIPTION OF EXEMPLARY EMBODIMENTS

An apparatus and method for performing high throughput non-plasma processing is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" or variation thereof means that a particular feature, structure, material, or characteristic described in connection with the embodiment is included in at least one embodiment of the invention, but do not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

There is a general need for a system and method for high-throughput treatment of a plurality of substrates, and to a system and method for high-throughput chemical and thermal treatment of a plurality of substrates. By using a plurality of substrate holders and a dedicated handler per station, the chemical and thermal treatment throughput of a plurality of substrates may be improved.

Figure 1:
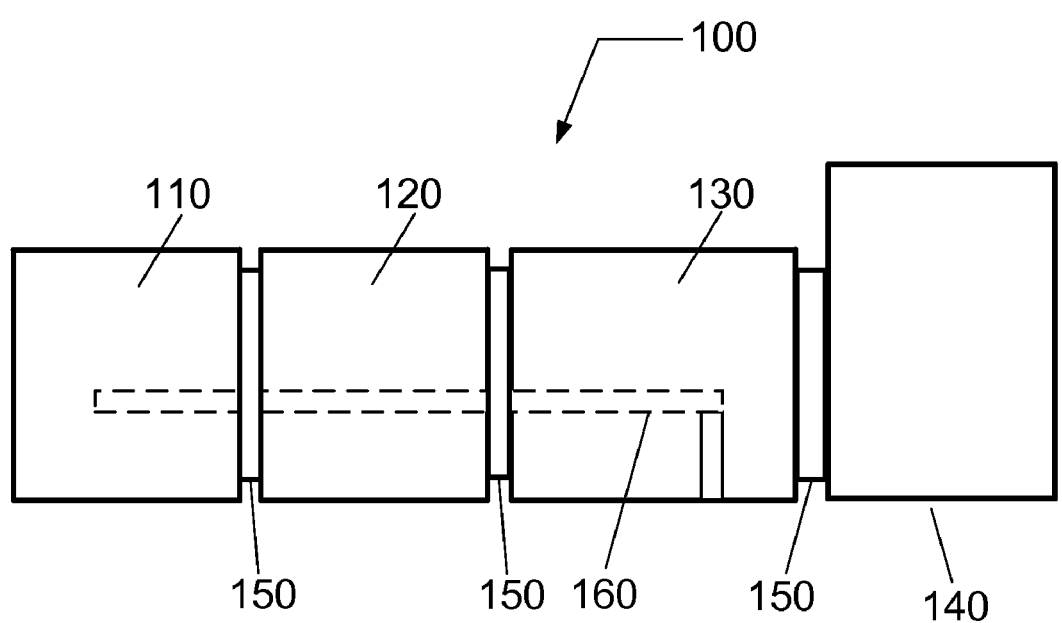
FIG. 1 illustrates a side view schematic representation of a transfer system for a first treatment system and a second treatment system according to an embodiment.

According to one embodiment, FIG. 1 presents a side-view of a processing platform 100 for processing a plurality of substrates. For example, the process may include a dry, non-plasma etching process or a dry, non-plasma cleaning process. For example, the process may be used to trim a mask layer, or remove residue and other contaminants from surfaces of the substrate. Furthermore, for example, the process may include a chemical oxide removal process.

The processing platform 100 comprises a first treatment system 110 and a second treatment system 120 coupled to the first treatment system 110. In one embodiment, the first treatment system 110 is a chemical treatment system, and the second treatment system 120 is a thermal treatment system. In another embodiment, the second treatment system 120 is a substrate rinsing system, such as a water rinsing system. Also, as illustrated in FIG. 1, a transfer system 130 is coupled to the first treatment system 110 to transfer a plurality of substrates in and out of the first treatment system 110 and the second treatment system 120, and also to exchange a plurality of substrates with a multi-element manufacturing system 140. The multi-element manufacturing system may comprise a load-lock element to allow cassettes of substrates to cycle between ambient conditions and low pressure conditions.

The first and second treatment systems 110, 120, and the transfer system 130 can, for example, comprise a processing element within the multi-element manufacturing system 140. The transfer system 130 may comprise a dedicated handler 160 for moving a plurality of substrates between the first treatment system 110, the second treatment system 120 and the multi-element manufacturing system 140. For example, the dedicated handler 160 is dedicated to transferring the plurality of substrates between the treatment systems (first treatment system 110 and second treatment system 120) and the multi-element manufacturing system 140, however the embodiment is not so limited.

In one embodiment, the multi-element manufacturing system 140 may permit the transfer of substrates to and from processing elements including such devices as etch systems, deposition systems, coating systems, patterning systems, metrology systems, etc. In order to isolate the processes occurring in the first and second systems, an isolation assembly 150 is utilized to couple each system. For instance, the isolation assembly 150 may comprise at least one of a thermal insulation assembly to provide thermal isolation and a gate valve assembly to provide vacuum isolation. Of course, treatment systems 110 and 120, and transfer system 130 may be placed in any sequence.

Figure 2:
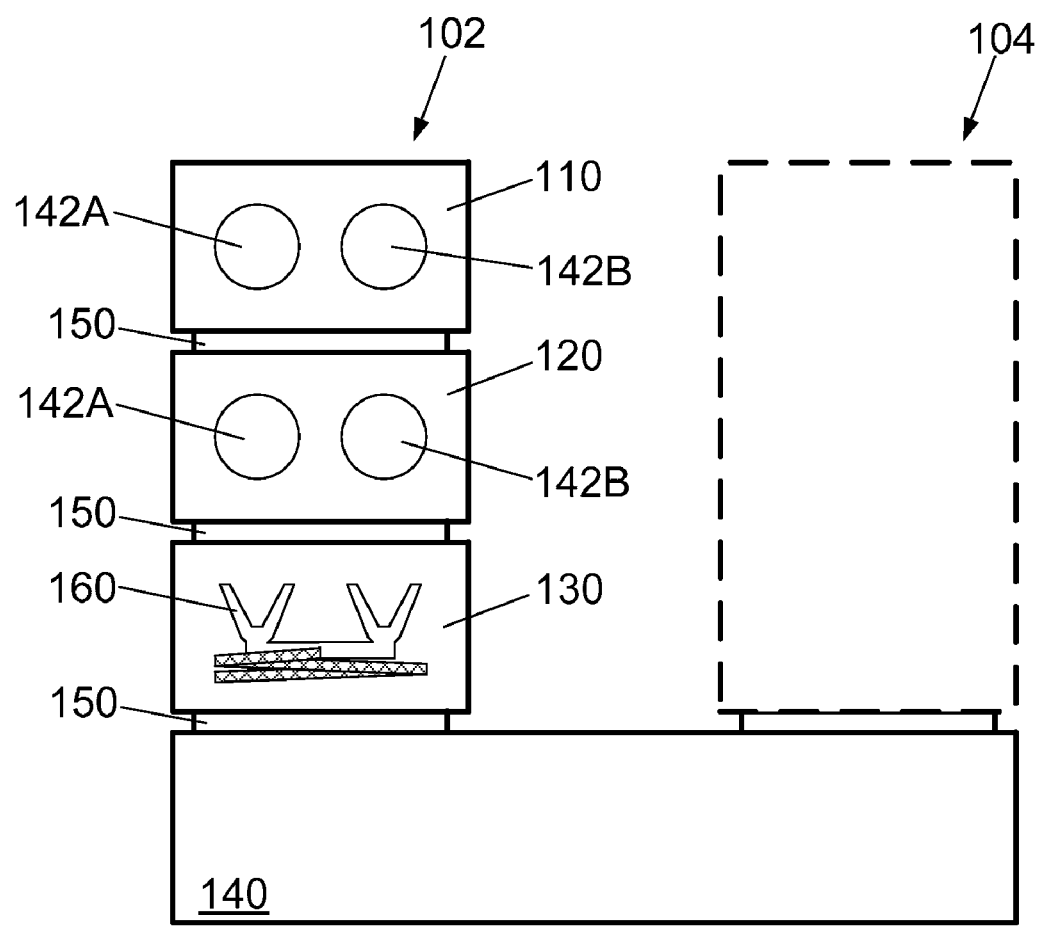
FIG. 2 illustrates a top view schematic representation of the transfer system depicted in FIG. 1.

FIG. 2 presents a top-view of the processing platform 100 illustrated in FIG. 1 for processing a plurality of substrates. In this embodiment, a substrate 142A is processed side-by-side with another substrate 142B in the same treatment system. In an alternative embodiment, not shown, the substrates 142A, 142B may be processed front-to-back, though the embodiment is not so limited. Although only two substrates are shown in each treatment system in FIG. 2, two or more substrates may be processed in parallel in each treatment system.

Referring still to FIG. 2, the processing platform 100 may comprise a first process element 102 and a second process element 104 configured to extend from the multi-element manufacturing system 140 and work in parallel with one another. As illustrated in FIGS. 1 and 2, the first process element 102 may comprise first treatment system 110 and second treatment system 120, wherein a transfer system 130 utilizes the dedicated substrate handler 160 to move substrate 142 into and out of the first process element 102.

Figure 3:
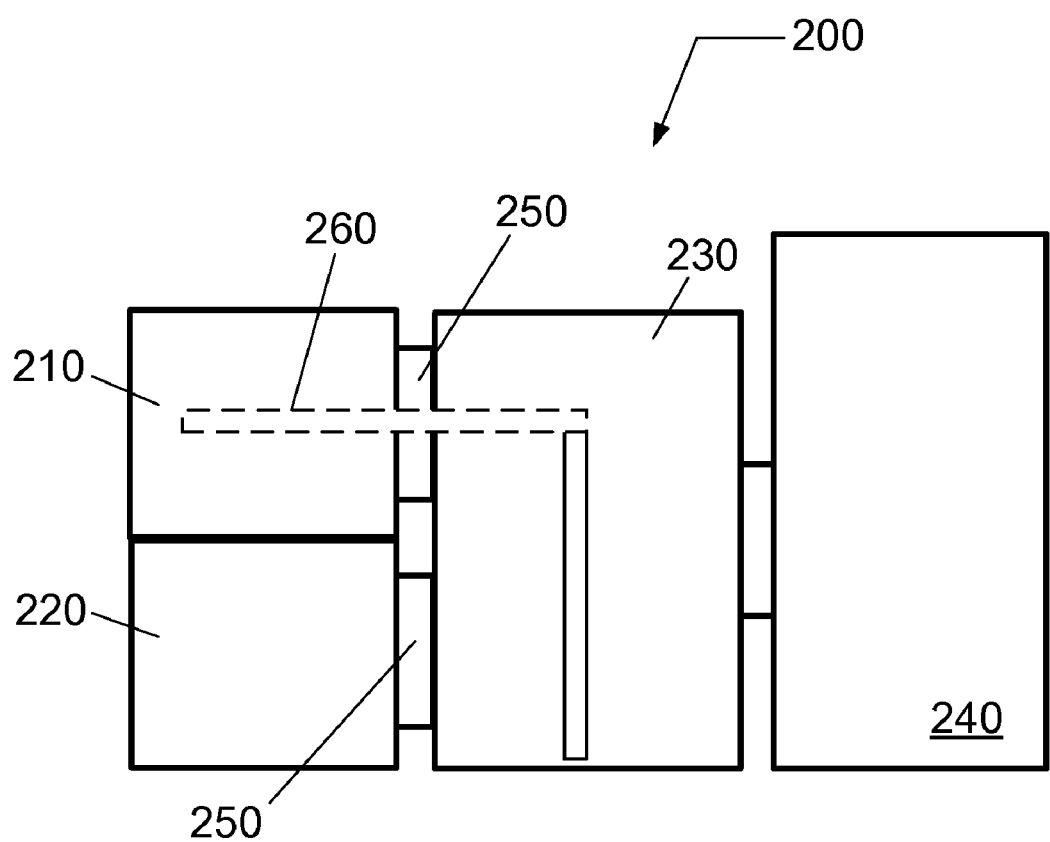
FIG. 3 illustrates a side view schematic representation of a transfer system for a first treatment system and a second treatment system according to another embodiment.

Alternatively, FIG. 3 presents a side-view of a processing platform 200 for processing a plurality of substrates according to another embodiment. For example, the process may include a dry, non-plasma etching process or a dry, non-plasma cleaning process. For example, the process may be used to trim a mask layer, or remove residue and other contaminants from surfaces of the substrate. Furthermore, for example, the process may include a chemical oxide removal process.

The processing platform 200 comprises a first treatment system 210, and a second treatment system 220, wherein the first treatment system 210 is stacked atop the second treatment system 220 in a vertical direction as shown. For example, the first treatment system 210 is a chemical treatment system, and the second treatment system 220 is a thermal treatment system. Alternately, the second treatment system 220 is a substrate rinsing system, such as a water rinsing system. Also, as illustrated in FIG. 3, a transfer system 230 may be coupled to the first treatment system 210, in order to transfer substrates into and out of the first treatment system 210, and coupled to the second treatment system 220, in order to transfer substrates into and out of the second treatment system 220. The transfer system 230 may comprise a dedicated handler 260 for moving a plurality of substrates between the first treatment system 210, the second treatment system 220 and the multi-element manufacturing system 240. The handler 260 may be dedicated to transferring the substrates between the treatment systems (first treatment system 210 and second treatment system 220) and the multi-element manufacturing system 240, however the embodiment is not so limited.

Additionally, transfer system 230 may exchange substrates with one or more substrate cassettes (not shown). Although only two process systems are illustrated in FIG. 3, other process systems can access transfer system 230 or multi-element manufacturing system 240 including such devices as etch systems, deposition systems, coating systems, patterning systems, metrology systems, etc. An isolation assembly 250 can be used to couple each system in order to isolate the processes occurring in the first and second treatment systems. For instance, the isolation assembly 250 may comprise at least one of a thermal insulation assembly to provide thermal isolation, and a gate valve assembly to provide vacuum isolation. Additionally, for example, the transfer system 230 can serve as part of the isolation assembly 250.

In general, at least one of the first treatment system 110 and the second treatment system 120 of the processing platform 100 depicted in FIG. 1 comprises at least two transfer openings to permit passage of the plurality of substrates. For example, as depicted in FIG. 1, the second treatment system 120 comprises two transfer openings, the first transfer opening permits the passage of the substrates between the first treatment system 110 and the second treatment system 120 and the second transfer opening permits the passage of the substrates between the transfer system 130 and the second treatment system 120. However, regarding the processing platform 100 depicted in FIG. 1 and FIG. 2, and the processing platform 200 depicted in FIG. 3, each treatment system, respectively, comprises at least one transfer opening to permit passage of the plurality of substrates.

Figure 4:
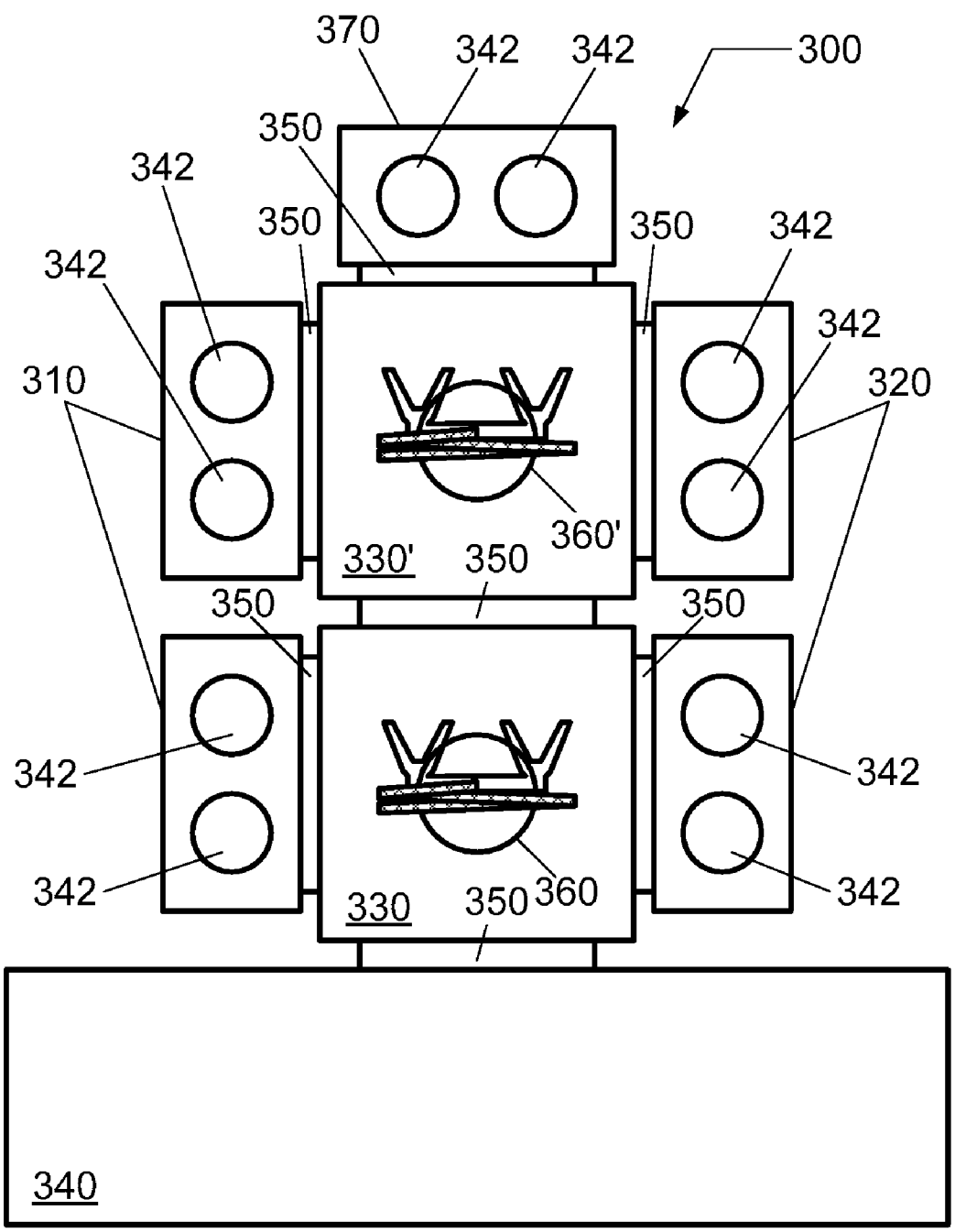
FIG. 4 illustrates a top view schematic representation of a transfer system for a first treatment system and a second treatment system according to another embodiment.

According to another embodiment, FIG. 4 presents a top view of a processing platform 300 for processing a plurality of substrates. For example, the process may include a dry, non-plasma etching process or a dry, non-plasma cleaning process. For example, the process may be used to trim a mask layer, or remove residue and other contaminants from surfaces of the substrate. Furthermore, for example, the process may include a chemical oxide removal process.

The processing platform 300 comprises a first treatment system 310, a second treatment system 320, and an optional auxiliary treatment system 370 coupled to a first transfer system 330 and an optional second transfer system 330'. In one embodiment, the first treatment system 310 is a chemical treatment system, and the second treatment system 320 is a thermal treatment system. In another embodiment, the second treatment system 320 is a substrate rinsing system, such as a water rinsing system. Also, as illustrated in FIG. 4, the first transfer system 330 and the optional second transfer system 330' are coupled to the first treatment system 310 and the second treatment system 320, and configured to transfer a plurality of substrates in and out of the first treatment system 310 and the second treatment system 320, and also to exchange a plurality of substrates with a multi-element manufacturing system 340. The multi-element manufacturing system 340 may comprise a load-lock element to allow cassettes of substrates to cycle between ambient conditions and low pressure conditions.

The first and second treatment systems 310, 320, and the first and optional second transfer systems 330, 330' can, for example, comprise a processing element within the multi-element manufacturing system 340. The transfer system 330 may comprise a first dedicated handler 360 and the optional second transfer system 330' comprises an optional second dedicated handler 360' for moving a plurality of substrates between the first treatment system 310, the second treatment system 320, the optional auxiliary treatment system 370 and the multi-element manufacturing system 340.

In one embodiment, the multi-element manufacturing system 340 may permit the transfer of substrates to and from processing elements including such devices as etch systems, deposition systems, coating systems, patterning systems, metrology systems, etc. Furthermore, the multi-element manufacturing system 340 may permit the transfer of substrates to and from the auxiliary treatment system 370, wherein the auxiliary treatment system 370 may include an etch system, a deposition system, a coating system, a patterning system, a metrology system, etc.

In order to isolate the processes occurring in the first and second systems, an isolation assembly 350 is utilized to couple each system. For instance, the isolation assembly 350 may comprise at least one of a thermal insulation assembly to provide thermal isolation and a gate valve assembly to provide vacuum isolation. Of course, treatment systems 310 and 320, and transfer systems 330 and 330' may be placed in any sequence.

As illustrated in FIG. 4, in this embodiment, two or more substrates 342 can be processed side-by-side in the same treatment system. In an alternative embodiment, not shown, the substrates 342 may be processed front-to-back, though the embodiment is not so limited. Although only two substrates are shown in each treatment system in FIG. 4, two or more substrates may be processed in parallel in each treatment system.

Figure 5:
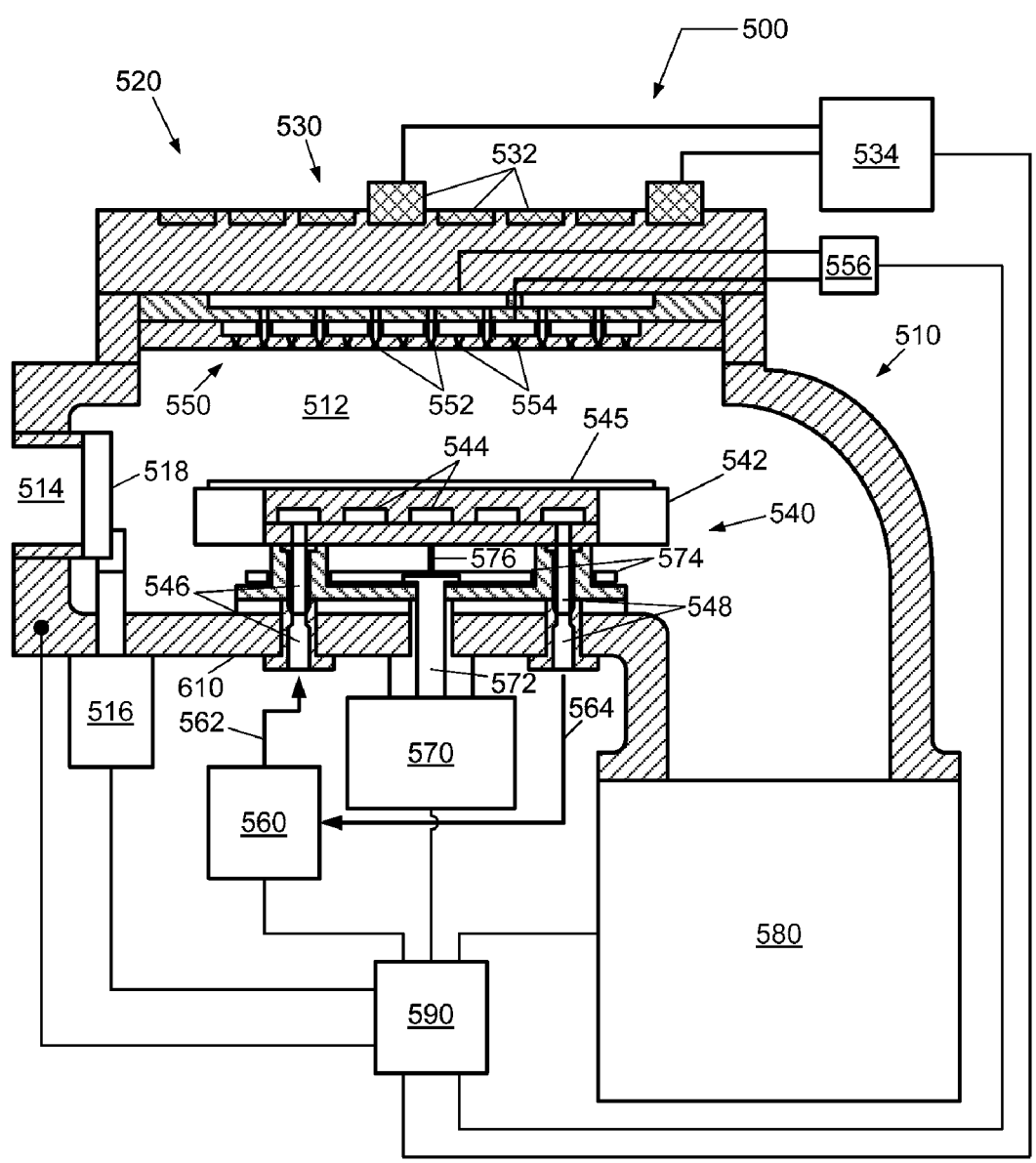
FIG. 5 illustrates a cross-sectional side view of a chemical treatment system according to an embodiment.
Figure 11A:
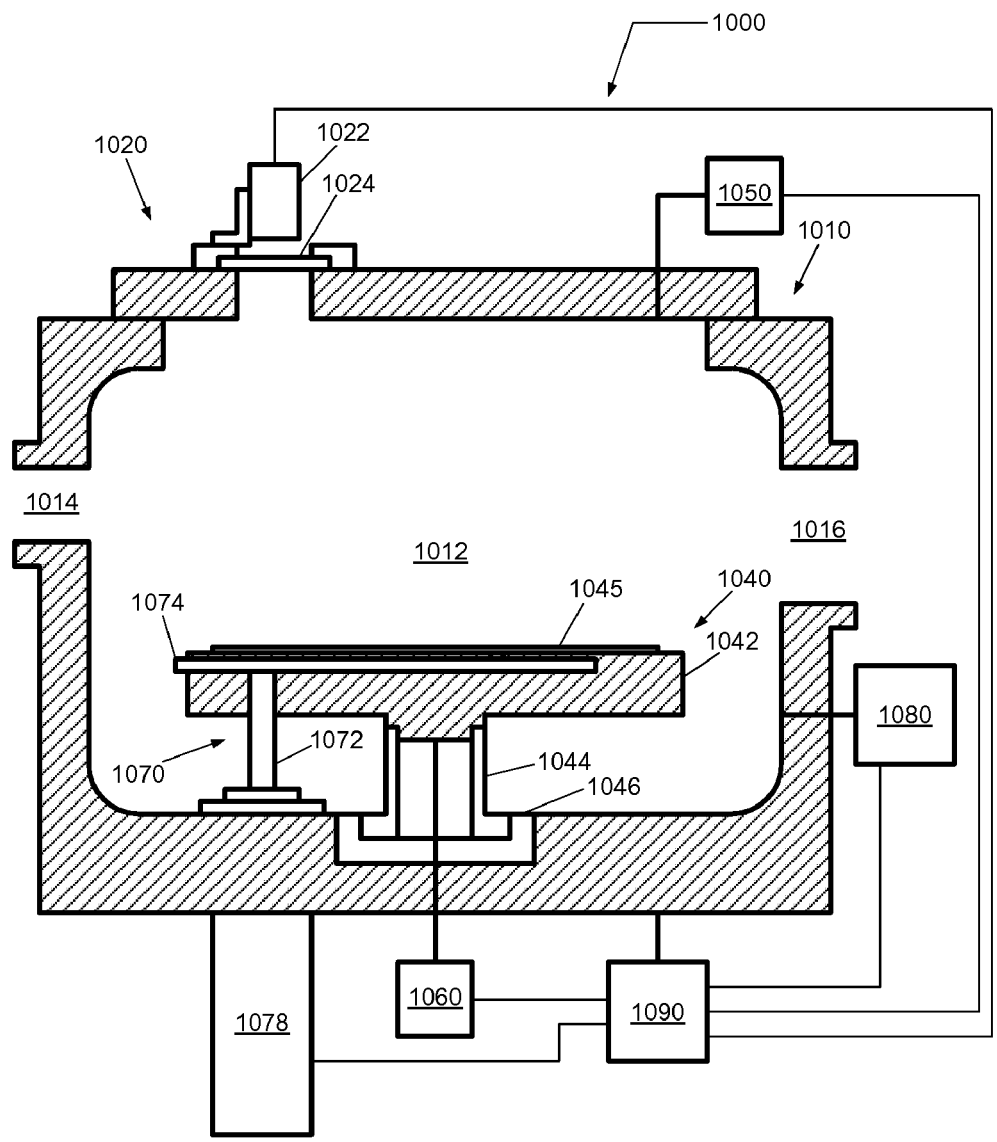
FIGS. 11A and 11B illustrate a cross-sectional side view of a thermal treatment system according to an embodiment.
Figure 11B:
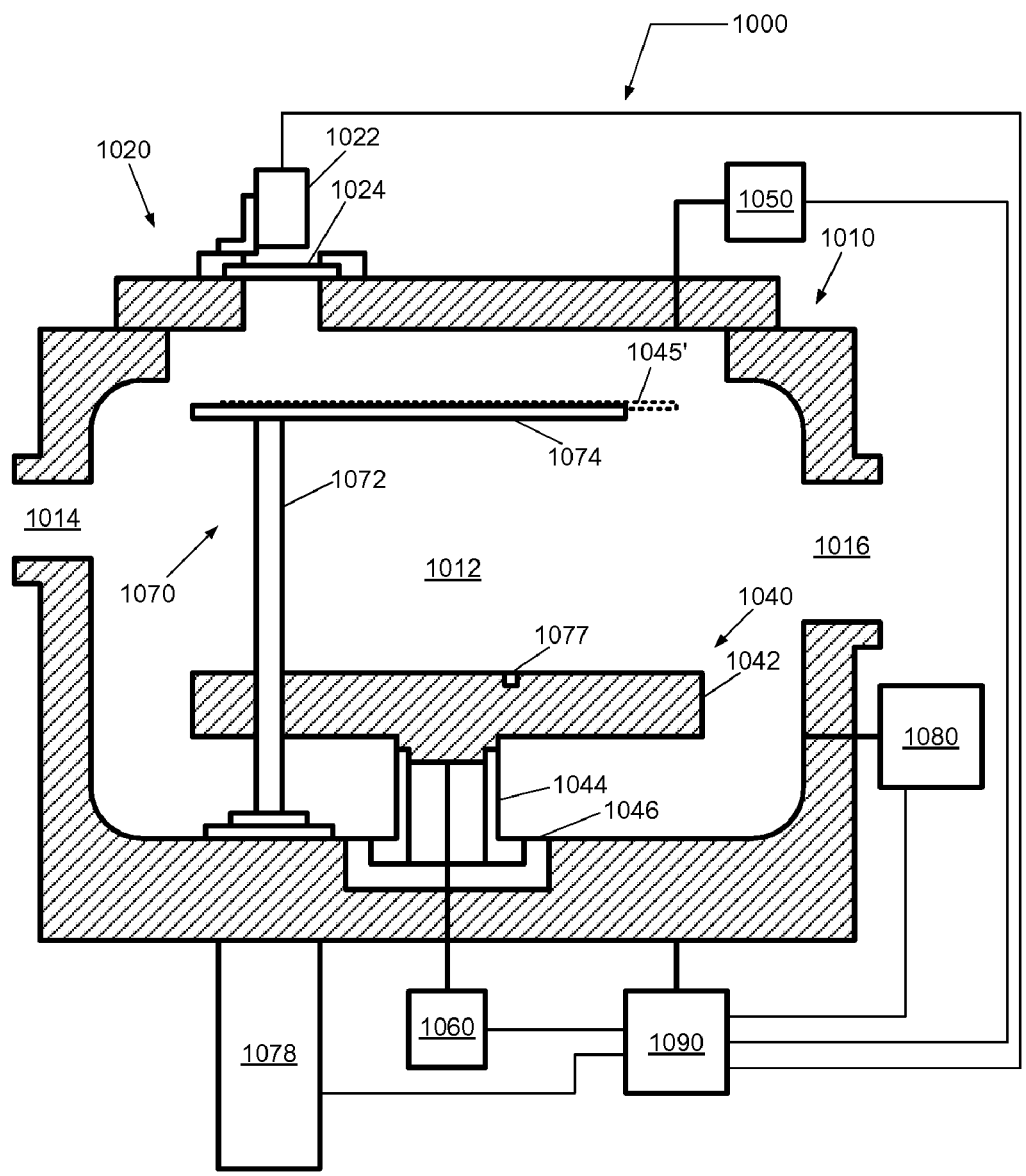

Referring to FIGS. 5, 11A and 11B, a processing platform, as described above, may comprise a chemical treatment system 500 for chemically treating a plurality of substrates and a thermal treatment system 1000 for thermally treating the plurality of substrates. For example, the processing platform comprises chemical treatment system 500 and thermal treatment system 1000 coupled to the chemical treatment system 500. The chemical treatment system 500 comprises a chemical treatment chamber 510, which can be temperature-controlled. The thermal treatment system 1000 comprises a thermal treatment chamber 1010, which can be temperature-controlled. The chemical treatment chamber 510 and the thermal treatment chamber 1010 can be thermally insulated from one another using a thermal insulation assembly, and vacuum isolated from one another using a gate valve assembly, to be described in greater detail below.

As illustrated in FIG. 5, the chemical treatment system 500 further comprises a temperature-controlled substrate holder 540 mounted within the chemical treatment chamber 510 and configured to support two or more substrates 545 on a support surface thereof, an upper assembly 520 coupled to an upper section of the chemical treatment chamber 510, and a vacuum pumping system 580 coupled to the chemical treatment chamber 510 to evacuate the chemical treatment chamber 510.

The upper assembly 520 comprises a gas injection assembly 550 coupled to the chemical treatment chamber 510 and configured to introduce one or more process gases to a process space 512 in the chemical treatment chamber 510 in order to chemically alter exposed surface layers on the two or more substrates 545. Additionally, the upper assembly 520 comprises a heater assembly 530 coupled to the gas injection assembly 550 and configured to elevate a temperature of the gas injection assembly 550.

The chemical treatment chamber 510 comprises an opening 514 through which the plurality of substrates 545 may be transported into and out of the chemical treatment chamber 510. Opening 514 in chemical treatment chamber 510 may define a common passage with opening 1016 in thermal treatment chamber 1010 through which the plurality of substrates 545 can be transferred between chemical treatment chamber 510 and thermal treatment chamber 1010.

During processing, the common passage can be sealed closed using a gate valve assembly 518 in order to permit independent processing in the two chambers 510, 1010. As shown in FIG. 5, the gate valve assembly 518 may include a drive system 516, such as a pneumatic drive system. Furthermore, a transfer opening 1014 can be formed in the thermal treatment chamber 1010 in order to permit substrate exchanges with a transfer system as illustrated in FIGS. 1 through 4. For example, a second thermal insulation assembly (not shown) may be implemented to thermally insulate the thermal treatment chamber 1010 from a transfer system (not shown). Although the opening 1014 is illustrated as part of the thermal treatment chamber 1010 (consistent with FIG. 1), the transfer opening 1014 can be formed in the chemical treatment chamber 510 and not the thermal treatment chamber 1010 (reverse chamber positions as shown in FIG. 1), or the transfer opening 1014 can be formed in both the chemical treatment chamber 510 and the thermal treatment chamber 1010.

As illustrated in FIG. 5, the chemical treatment system 500 comprises temperature controlled substrate holder 540 to provide several operational functions for thermally controlling and processing substrates 545. The substrate holder 540 comprises one or more temperature control elements configured to adjust and/or elevate a temperature of the plurality of substrates 545.

The one or more temperature control elements may be configured to heat and/or cool substrates 545. For example, the temperature-controlled substrate holder 540 may include a cooling system having a re-circulating flow of a heat transfer fluid that receives heat from substrate holder 540 and transfers heat to a heat exchanger system (not shown), or alternatively, a heating system having a re-circulating flow of a heat transfer fluid that receives heat from a heat exchanger (not shown) and transfers heat to substrate holder 540. In other embodiments, the temperature control elements may include resistive heating elements, or thermo-electric heaters/coolers. These temperature control elements may be utilized for controlling the temperature of the substrate holder 540, a chamber wall of chemical treatment chamber 510, and upper assembly 520.

Figure 6:
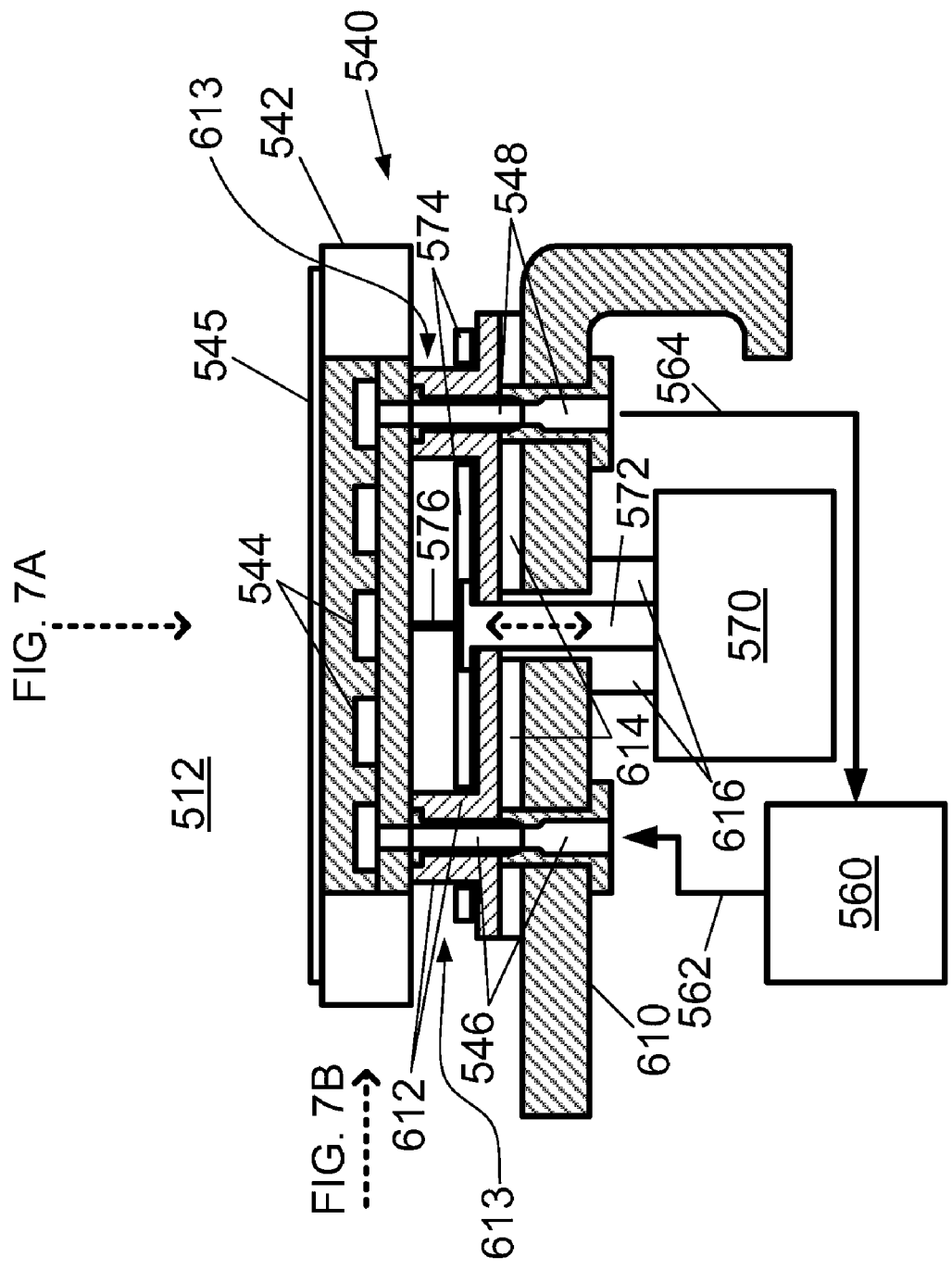
FIG. 6 provides an exploded view of the cross-sectional side view of the chemical treatment system depicted in FIG. 5.

According to one embodiment, FIG. 6 presents several views of a substrate holder for performing several of the above-identified functions. In FIG. 6, an exploded, cross-sectional view of temperature-controlled substrate holder 540 depicted in FIG. 5 is shown. The substrate holder 540 comprises a temperature-controlled substrate table 542 having an upper surface configured to support two or more substrates, a lower surface opposite the upper surface, and an edge surface, a chamber mating component 612 coupled to the lower surface of the temperature-controlled substrate table 542, and an insulating component 614 disposed between a bottom of chamber mating component 612 and a lower chamber wall 610 of chemical treatment chamber 510. The chamber mating component 612 may include two or more support columns 613 configured to support the temperature-controlled substrate table 542 at a distance from the lower chamber wall 610 of the chemical treatment chamber 510, wherein each of the two or more support columns 613 comprises a first end coupled to a lower surface of the temperature-controlled substrate table 542 and a second end coupled to the lower chamber wall 610 of the chemical treatment chamber 510.

The temperature-controlled substrate table 542 and the chamber mating component 612 may, for example, be fabricated from an electrically and thermally conducting material such as aluminum, stainless steel, nickel, etc. The insulating component 614 can, for example, be fabricated from a thermally-resistant material having a relatively lower thermal conductivity such as quartz, alumina, Teflon, etc.

The temperature-controlled substrate table 542 may comprise temperature control elements such as cooling channels, heating channels, resistive heating elements, or thermoelectric elements. For example, as illustrated in FIG. 6, the temperature-controlled substrate table 542 comprises a fluid channel 544 formed within an interior of the temperature-controlled substrate table 542. The fluid channel 544 comprises an inlet fluid conduit 546 and an outlet fluid conduit 548.

A substrate holder temperature control system 560 comprises a fluid thermal unit constructed and arranged to control a temperature of a heat transfer fluid. The fluid thermal unit may comprise a fluid storage tank, a pump, a heater, a cooler, and a fluid temperature sensor. For example, the substrate holder temperature control system 560 facilitates the supply of an inlet flow 562 of the heat transfer fluid and the exhaust of an outlet flow 564 of the heat transfer fluid using the fluid thermal unit. The substrate holder temperature control system 560 further comprises a controller coupled to the fluid thermal unit, and configured to perform at least one of monitoring, adjusting or controlling the temperature of the heat transfer fluid.

For example, the substrate holder temperature control system 560 may receive a temperature measurement from a temperature sensor coupled to the temperature-controlled substrate table 542, and configured to measure a substrate holder temperature. Additionally, for example, the substrate holder temperature control system 560 may compare the substrate holder temperature to a target substrate holder temperature, and then utilize the controller to adjust the temperature of the heat transfer fluid, or a flow rate of the heat transfer fluid, or a combination thereof to reduce a difference between the substrate holder temperature and the target substrate holder temperature.

Further yet, for example, the substrate holder temperature control system 560 may receive a plurality of temperature measurements from a plurality of temperature sensors coupled to the temperature-controlled substrate table 542, and may utilize the controller to perform at least one of monitoring, adjusting or controlling the plurality of substrate holder temperatures to alter a temperature uniformity of the temperature-controlled substrate table 542.

The fluid channel 544 may, for example, be a spiral or serpentine passage within the temperature-controlled substrate table 542 that permits a flow rate of fluid, such as water, Fluorinert, Galden HT-135, etc., in order to provide conductive-convective heating or cooling of the temperature-controlled substrate table 542. Alternately, the temperature-controlled substrate table 542 may comprise an array of thermoelectric elements capable of heating or cooling a substrate depending upon the direction of electrical current flow through the respective elements. An exemplary thermoelectric element is one commercially available from Advanced Thermoelectric, Model ST-127-1.4-8.5M (a 40 mm by 40 mm by 3.4 mm thermoelectric device capable of a maximum heat transfer power of 72 W).

Although a single fluid channel 544 is shown, the temperature-controlled substrate table 542 may include one or more additional fluid channels formed within the interior of the temperature-controlled substrate table 542, wherein each of the one or more additional fluid channels has an additional inlet end and an additional outlet end, and wherein each of the additional inlet ends and each of the additional outlet ends are configured to receive and return additional heat transfer fluid through the two or more support columns 613.

The insulating component 614 may further comprise a thermal insulation gap in order to provide additional thermal insulation between the temperature-controlled substrate table 542 and the chemical treatment chamber 510. The thermal insulation gap may be evacuated using a pumping system (not shown) or a vacuum line as part of vacuum pumping system 580, and/or coupled to a gas supply (not shown) in order to vary its thermal conductivity. The gas supply can, for example, be a backside gas supply utilized to couple heat transfer gas to the back-side of the substrates 545.

Each component 542, 612, and 614 further comprises fastening devices (such as bolts and tapped holes) in order to affix one component to another, and to affix the temperature-controlled substrate holder 540 to the chemical treatment chamber 510. Furthermore, each component 542, 612, and 614 facilitates the passage of the above-described utilities to the respective component, and vacuum seals, such as elastomer O-rings, are utilized where necessary to preserve the vacuum integrity of the chemical treatment chamber 510.

Additionally, the temperature-controlled substrate holder 540 may comprise an electrostatic clamping system (not shown) (or mechanical clamping system) in order to electrically (or mechanically) clamp substrates 545 to the temperature controlled substrate holder 540. An electrostatic clamp (ESC) may comprise a ceramic layer, a clamping electrode embedded therein, and a high-voltage (HV) direct-current (DC) voltage supply coupled to the clamping electrode using an electrical connection. The ESC may, for example, be mono-polar, or bi-polar. The design and implementation of such a clamp is well known to those skilled in the art of electrostatic clamping systems.

Furthermore, the temperature-controlled substrate holder 540 may comprise a back-side gas supply system (not shown) for supplying a heat transfer gas. The heat transfer gas may, for example, be delivered to the back-side of substrates 545 to improve the gas-gap thermal conductance between substrates 545 and temperature-controlled substrate holder 540. For instance, the heat transfer gas supplied to the back-side of substrates 545 may comprise an inert gas such as helium, argon, xenon, krypton, a process gas, or other gas such as oxygen, nitrogen, or hydrogen. Such a system can be utilized when temperature control of the substrates is required at elevated or reduced temperatures. For example, the backside gas system can comprise a multi-zone gas distribution system such as a two-zone (center-edge) system, wherein the backside gas gap pressure can be independently varied between the center and the edge of substrates 545.

Further yet, the temperature-controlled substrate holder 540 may comprise a lift-pin assembly 570 comprising a first array of lift pins 576 configured to lift a first substrate to and from an upper surface of the temperature-controlled substrate table 542, and a second array of lift pins 576 configured to lift a second substrate to and from the upper surface of the temperature-controlled substrate table 542.

As shown in FIG. 6, the lift-pin assembly 570 comprises a lift pin support member 574, and a drive system 572 coupled through lower chamber wall 610 via feed-through 616 in the chemical treatment chamber 510, and configured to translate the lift pin support member 574 such that the first array of lift pins 576 translate through a first array of lift pin holes and the second array of lift pins 576 translate through a second array of lift pin holes.

A temperature of the temperature-controlled substrate holder 540 can be monitored using a temperature sensing device, such as a thermocouple (e.g. a K-type thermocouple, Pt sensor, etc.). Furthermore, the substrate holder temperature control system 560 may utilize the temperature measurement as feedback to the substrate holder 540 in order to control the temperature of substrate holder 540. For example, at least one of a fluid flow rate, a fluid temperature, a heat transfer gas type, a heat transfer gas pressure, a clamping force, a resistive heater element current or voltage, a thermoelectric device current or polarity, etc. may be adjusted in order to affect a change in the temperature of substrate holder 540 and/or the temperature of the substrates 545.

Figure 7A:
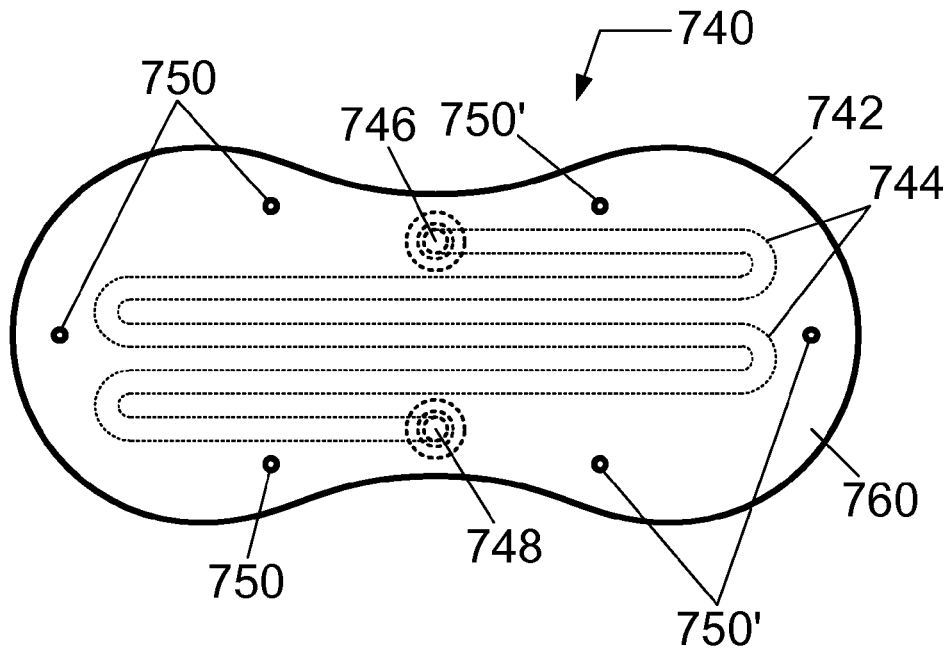
FIG. 7A provides a top view of a substrate holder according to an embodiment.
Figure 7B:
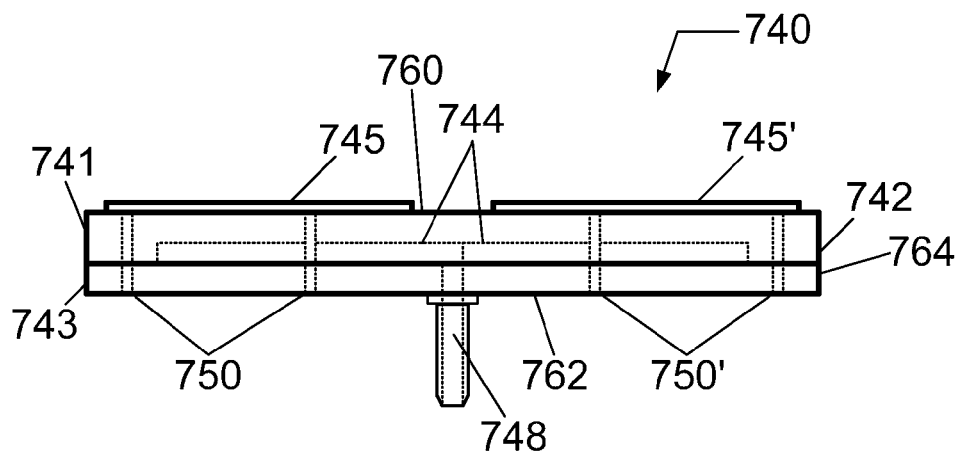
FIG. 7B provides a side view of the substrate holder depicted in FIG. 7A.

Referring now to FIGS. 7A and 7B, a top view and side view of a substrate holder is shown according to another embodiment. As shown in FIG. 7A, substrate holder 740 comprises a temperature-controlled substrate table 742 having a contiguous upper surface 760 configured to support two substrates 745 and 745', a lower surface 762 opposite the upper surface 760, and an edge surface 764. The temperature-controlled substrate table 742 is further configured to adjust and/or control a temperature of the two substrates 745 and 745'. The substrate holder 740 further comprises an inlet fluid conduit 746 and an outlet fluid conduit 748 configured to supply and exhaust a flow of heat transfer fluid through fluid channel 744.

As shown in FIG. 7A, the inlet fluid conduit 746 is formed through one of the two or more support columns, wherein the inlet fluid conduit 746 is configured to receive the heat transfer fluid from the fluid thermal unit and supply the heat transfer fluid to an inlet end of the fluid channel 744. Furthermore, the outlet fluid conduit 748 is formed through another of the two or more support columns, wherein the outlet fluid conduit 748 is configured to receive the heat transfer fluid from an outlet end of the fluid channel 744. The temperature-controlled substrate table 742 may comprise an upper section 741 and a lower section 743, wherein the fluid channel 744 is formed in the upper section 741 or the lower section 743 or both prior to combining the two sections. The upper section 741 and the lower section 743 may be combined by fastening the two sections to one another with a seal disposed therebetween, or by welding the two sections together.

The fluid channel 744 may have a serpentine shape; however, the shape of the fluid channel may be arbitrary. For example, FIG. 7D illustrates a substrate holder 740' having a fluid channel 744' having a more convoluted path.

Figure 7C:
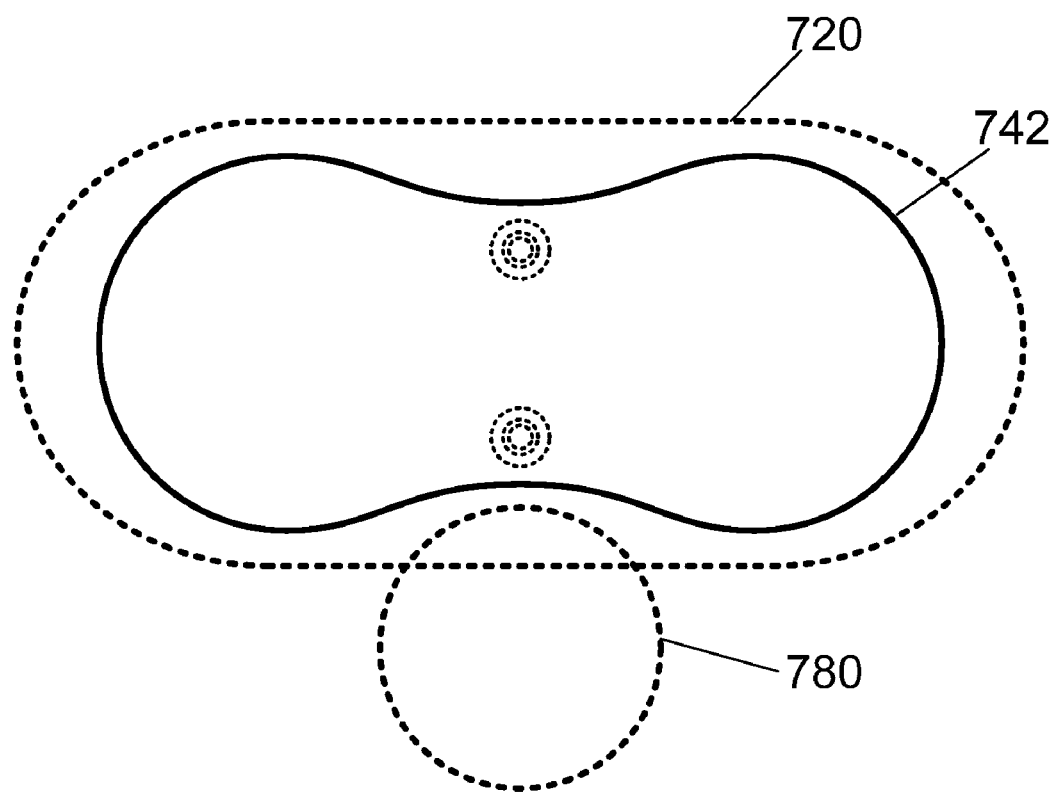
FIG. 7C illustrates a top view layout of a substrate holder and a pumping system in a chemical treatment system according to an embodiment.
Figure 7D:
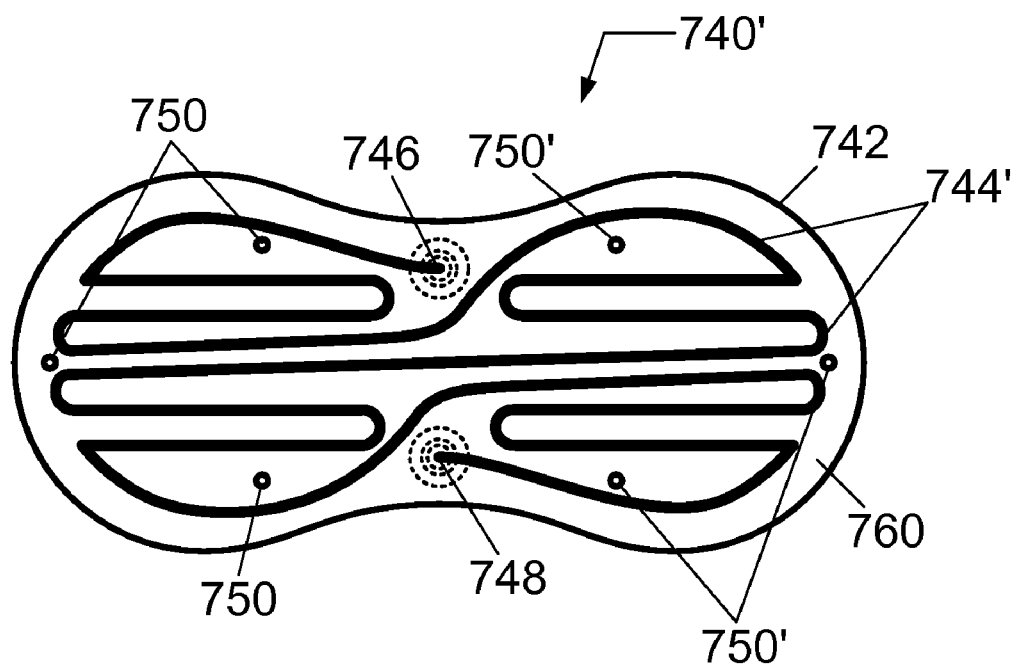
FIG. 7D provides a top view of a substrate holder according to another embodiment.

Referring to FIG. 7C, a top view of the temperature-controlled substrate table 742 is provided to illustrate an exemplary spatial relationship of the temperature-controlled substrate holder 742 relative to a chamber wall 720 and a vacuum pumping port 780 in the lower wall of the chemical treatment chamber. The temperature-controlled substrate holder 742 is shaped in a manner to improve flow conductance through the chemical treatment chamber to the vacuum pumping port 780.

Referring to FIGS. 7A, 7B, 7D, 8A, and 8B, the substrate holder 740 may further comprise a lift-pin assembly comprising a first array of three lift pin holes 750 configured to allow passage of a first array of lift pins 751 through the temperature-controlled substrate table 742 to lift the first substrate 745 to and from the upper surface 760 of the temperature-controlled substrate table 742, and a second array of three lift pin holes 750' configured to allow passage of a second array of lift pins 751' through the temperature-controlled substrate table 742 to lift a second substrate 745' to and from the upper surface 760 of the temperature-controlled substrate table 742.

Figure 8A:
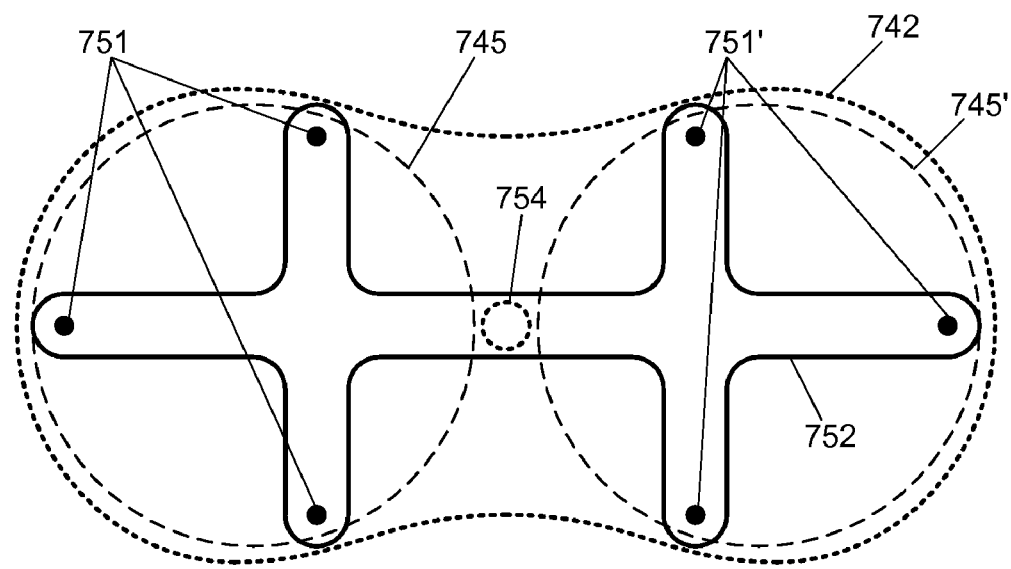
FIG. 8A provides a top view of a lift pin assembly according to an embodiment.
Figure 8B:
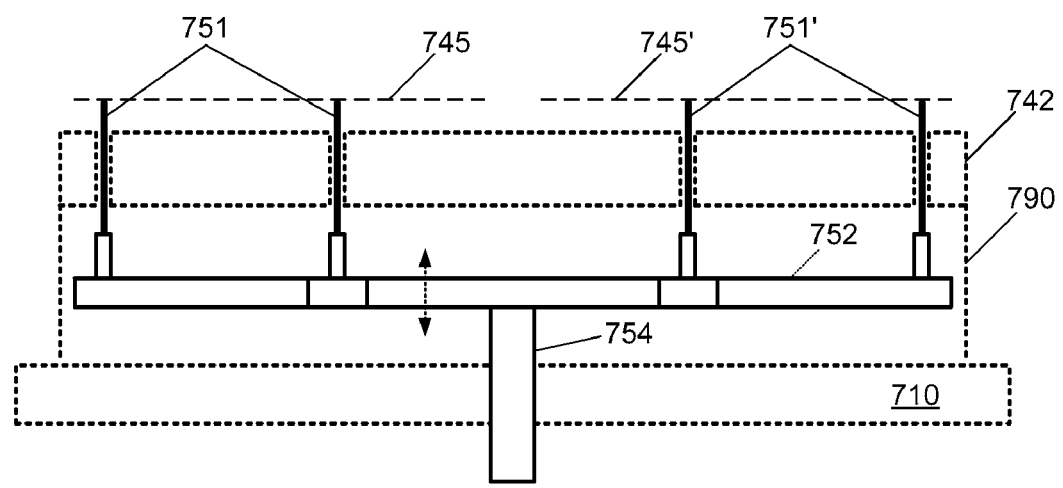
FIG. 8B provides a side view of the lift pin assembly depicted in FIG. 8A.

As shown in FIGS. 8A and 8B, the lift-pin assembly comprises a lift pin support member 752, and a drive system that includes a piston member 754 coupled through a wall 710 in the chemical treatment chamber 510, and configured to translate the lift pin support member 752 such that the first array of lift pins 751 translate through the first array of lift pin holes 750 and the second array of lift pins 751' translate through the second array of lift pin holes 750'. The first array of lift pins 751 is configured to align and pass through the first array of lift pin holes 750, wherein each lift pin in the first array of lift pins 751 comprises a first contact end configured to contact the first substrate and a first support end coupled to the lift pin support member 752. The second array of lift pins 751' are configured to align and pass through the second array of lift pin holes 750', wherein each lift pin in the second array of lift pins 751' comprises a second contact end configured to contact the second substrate and a second support end coupled to the lift pin support member 752. The piston member 754 is coupled to the lift pin support member 752 and is configured to vertically translate the lift pin support member 752 by sliding through a feed-through in wall 710.

Figure 8C:
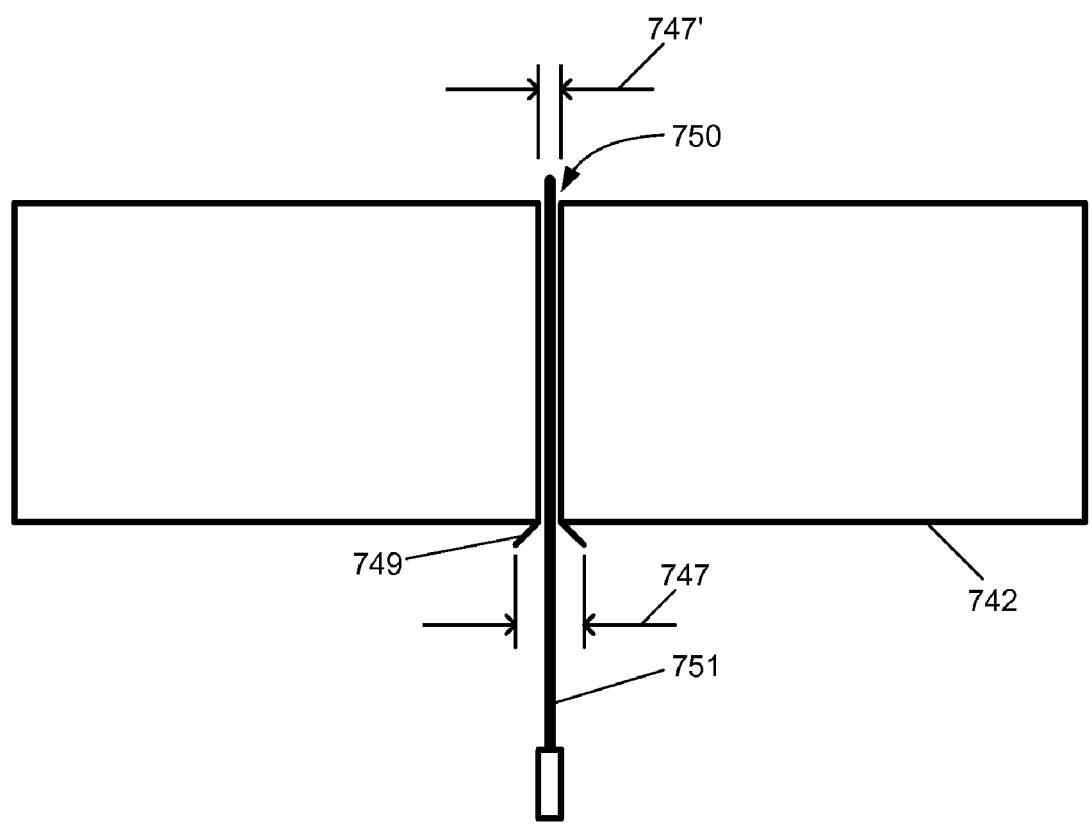
FIG. 8C provides an exploded view of a lift pin alignment device in a substrate holder according to an embodiment.

As illustrated in FIG. 8C, each lift pin hole in the first array of lift pin holes 750 and the second array of lift pins 751' may comprise an insert 749 having a flared end with a flared dimension 747 greater than a nominal dimension 747' of the lift-pin hole. The use of insert 749 may assist in the alignment of the first array of lift pins 751 with the first array of lift pin holes 750 and the second array of lift pins 751' with the second array of lift pin holes 750' during assembly of the substrate holder 740 (before, during, or after maintenance).

Furthermore, as shown in FIG. 8B, the temperature-controlled substrate table 742 may optionally comprise a skirt 790 coupled the lower surface 762 and/or edge surface 764. The skirt 790 may aid in reducing the amount of contamination and process residue that is deposited on the underside of the temperature-controlled substrate table 742 and the lift-pin assembly. Furthermore, the skirt 790 may aid in reducing the amount of gettering of process reactants by the underside of the temperature-controlled substrate table 742 (i.e., lower surface 762) and the lift-pin assembly.

As described above, the upper assembly 520 comprises gas injection assembly 550 coupled to the chemical treatment chamber 510, and configured to introduce one or more process gases to a process space 512, and heater assembly 530 coupled to the gas injection assembly 550 and configured to elevate a temperature of the gas injection assembly 550.

The gas injection assembly 550 may comprise a showerhead gas injection system having a gas distribution assembly, and one or more gas distribution plates coupled to the gas distribution assembly and configured to form one or more gas distribution plenums. Although not shown, the one or more gas distribution plenums may comprise one or more gas distribution baffle plates. The one or more gas distribution plates further comprise one or more gas distribution orifices to distribute a process gas from the one or more gas distribution plenums to the process space 512 within chemical treatment chamber 510. Additionally, one or more gas supply lines may be coupled to the one or more gas distribution plenums through, for example, the gas distribution assembly in order to supply a process gas comprising one or more gases. The process gas can, for example, comprise $NH_3$, HF, $H_2$, $O_2$, CO, $CO_2$, Ar, He, etc.

As shown in FIG. 5, the gas injection assembly 550 may be configured for distributing a process gas comprising at least two gases into chemical treatment chamber 510. The gas injection assembly 550 may comprise a first array of orifices 552 for introducing a first process gas from a gas supply system 556, and a second array of orifices 554 for introducing a second process gas from the gas supply system 556. For example, the first process gas may contain HF, and the second process gas may contain $NH_3$ and optionally Ar.

Figure 9:
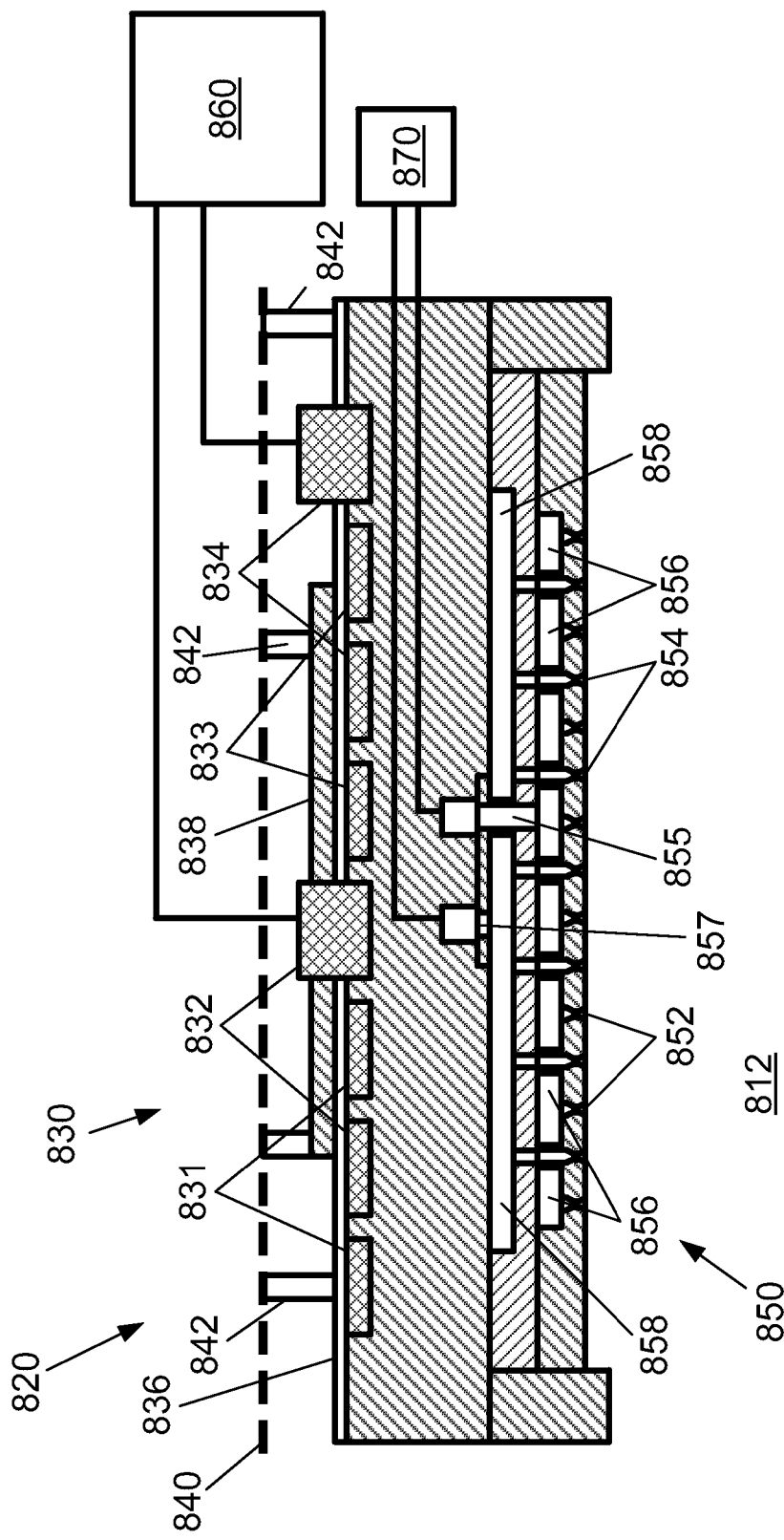
FIG. 9 provides a cross-sectional view of a heater assembly according to an embodiment.

As shown in FIG. 9 (expanded view of FIG. 5 with additional detail), an upper assembly 820 comprises a gas injection assembly 850, and a heater assembly 830 coupled to the gas injection assembly 850 and configured to elevate a temperature of the gas injection assembly 850. The gas injection assembly 850 is configured to distribute a process gas comprising at least two gases. The gas injection assembly 850 comprises a gas distribution assembly having a first gas distribution plenum 856 configured to introduce a first process gas to process space 812 through a first array of orifices 852, and a second gas distribution plenum 858 configured to introduce a second process gas to process space 812 through a second array of orifices 854. The first gas distribution plenum 856 is configured to receive the first process gas from a gas supply system 870 through a first passage 855, and the second gas distribution plenum 858 is configured to receive the second process gas from gas supply system 870 through a second passage 857. Although not shown, gas distribution plenums 856, 858 can comprise one or more gas distribution baffle plates.

The process gas can, for example, comprise $NH_3$, HF, $H_2$, $O_2$, CO, $CO_2$, Ar, He, etc. As a result of this arrangement, the first process gas and the second process gas may be independently introduced to the process space 812 without any interaction except in the process space 812.

As shown in FIG. 5, heater assembly 530 is coupled to the gas injection assembly 550 and configured to elevate a temperature of the gas injection assembly 550. The heater assembly 530 comprises a plurality of heating elements 532 and a power source 534 configured to couple power to the plurality of heating elements.

As shown in FIG. 9, the heater assembly 830 comprises a plurality of resistive heating elements 831, 832, 833, and 834 coupled to a upper surface of gas injection assembly 850. The heater assembly further comprises a power source 860 coupled to the plurality of resistive heating elements 831, 832, 833, and 834, and configured to couple electrical current to each of the plurality of resistive heating elements 831, 832, 833, and 834. The power source 860 may comprise a direct current (DC) power source or an alternating current (AC) power source. Furthermore, the plurality of resistive heating elements 831, 832, 833, and 834 may be connected in series or connected in parallel.

Additionally, the heater assembly 830 may further include an insulation member 836, and a clamp member 838 configured to affix the plurality of resistive heating elements 831, 832, 833, and 834 to the upper surface of the gas injection assembly 850. Furthermore, the heater assembly 830 may comprise a heat shield 840, and one or more columns 842 configured to shield the plurality of resistive heating elements 831, 832, 833, and 834 and stand off the heat shield 840 a distance from the upper surface of the gas injection assembly 850. Alternatively, insulation may be provided by heat insulation foam.

Figure 10A:
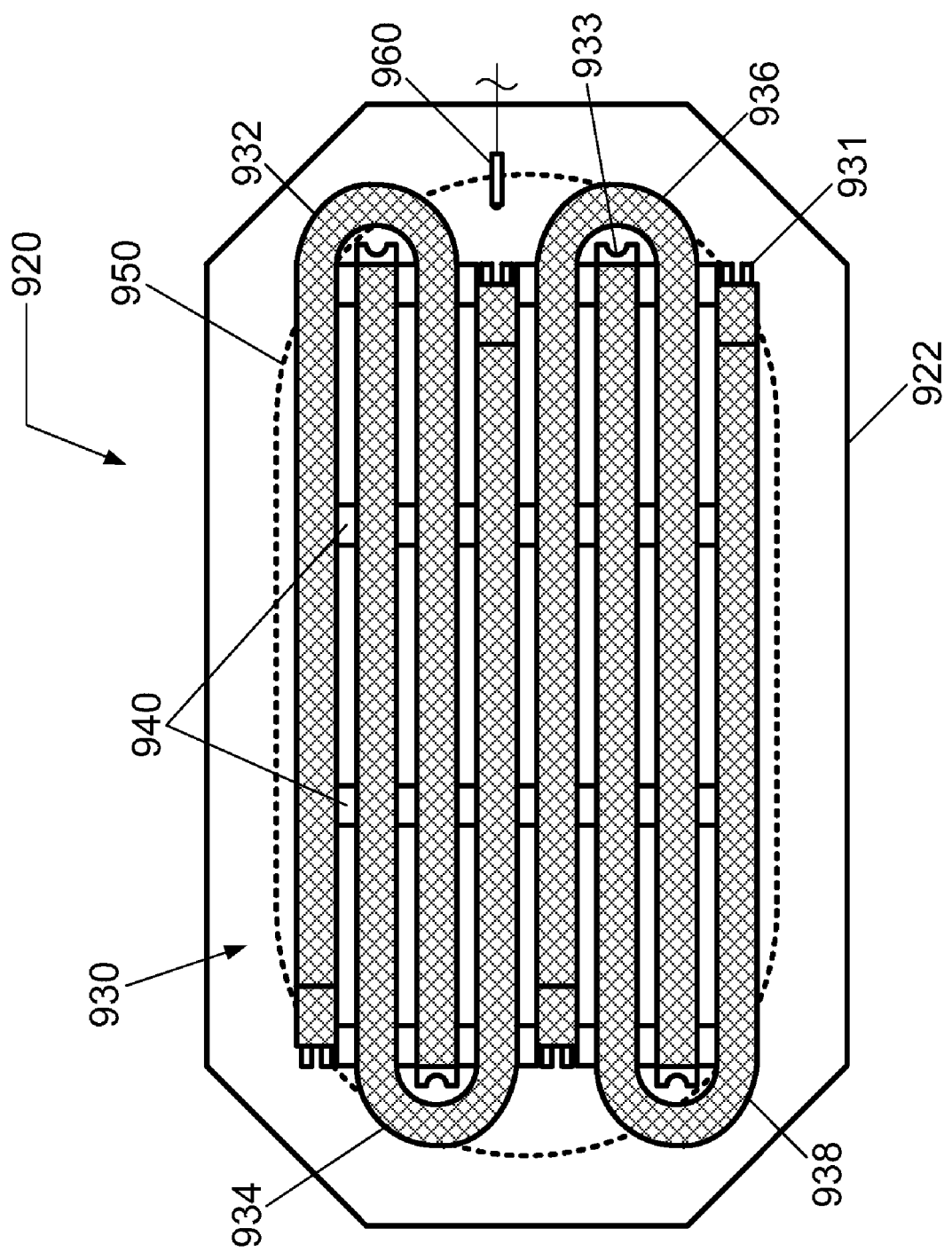
FIG. 10A provides a top view of a heater assembly according to an embodiment.
Figure 10B:
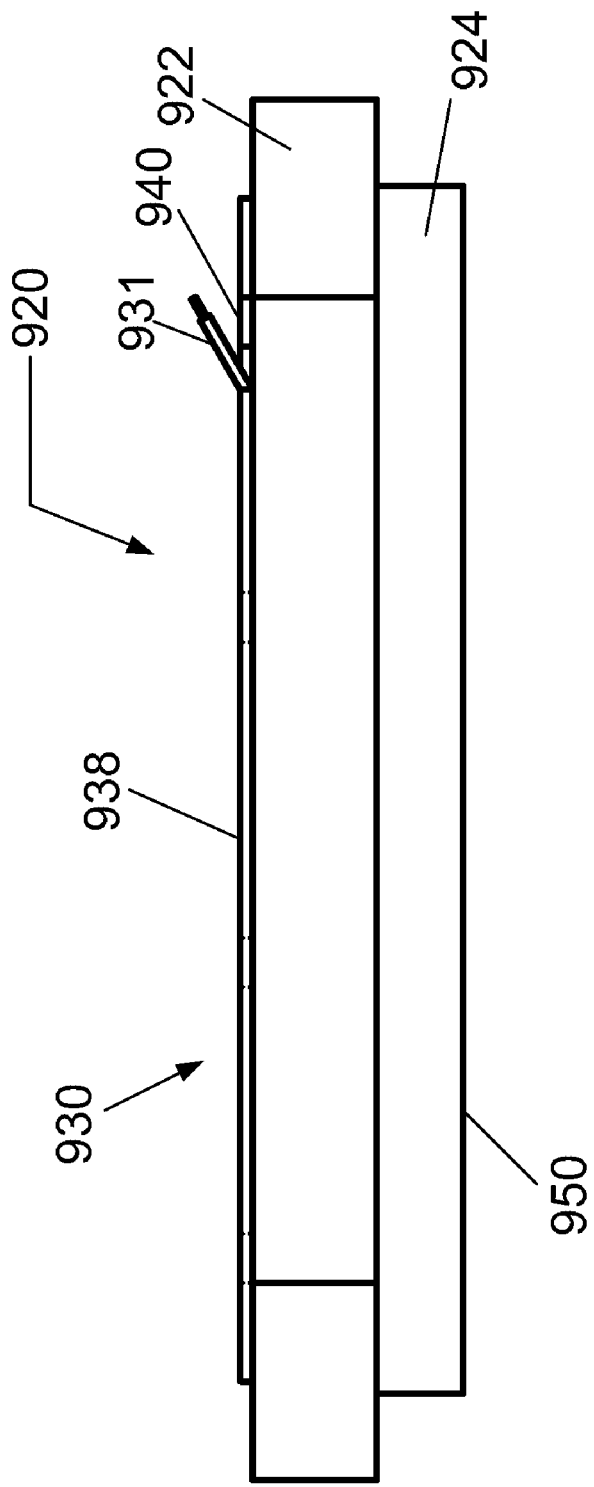
FIG. 10B provides a side view of the heater assembly depicted in FIG. 10A.

Referring now to FIGS. 10A and 10B, a top view and a side view of an upper assembly 920 comprising a heater assembly 930 and a gas injection assembly 950 are provided according to another embodiment. The upper assembly 920 may comprise a plate member 922 and a lower member 924. The heater assembly 930 comprises plate member 922 having an upper surface, and a plurality of resistive heating elements 932, 934, 936, and 938 coupled to the upper surface of the plate member 922. As shown in FIG. 10A, each of the plurality of resistive heating elements 932, 934, 936, and 938 comprises a heating element having a 180 degree major axis bend. For example, each of the plurality of resistive heating elements 932, 934, 936, and 938 comprises a first end 933 fixedly coupled to the upper surface of the plate member 922, a second end 931 configured to be coupled to a power source, a bend located between the first end 933 and the second end 931, a first straight section extending between the first end 933 and the bend, and a second straight section extending between the second end 931 and the bend.

The first straight section may be substantially parallel to the second straight section for each of the plurality of resistive heating elements 932, 934, 936, and 938. Additionally, the first straight section and the second straight section of one of the plurality of resistive heating elements 932, 934, 936, and 938 may be substantially parallel to the first straight section and the second straight section of another of the plurality of resistive heating elements. Furthermore, the plurality of resistive heating elements 932, 934, 936, and 938 may be arranged in pairs on the upper surface of the plate member 922. Further yet, one or more spacers 940 coupled to the upper surface of the plate member 922 may be arranged to position one of the plurality of resistive heating elements 932, 934, 936, and 938 relative to another of the plurality of resistive heating elements 932, 934, 936, and 938.

In order to uniformly heat and/or control the temperature profile of the gas distribution system, the plurality of resistive heating elements 932, 934, 936, and 938 may be arranged in an interlaced manner wherein at least two of the plurality of resistive heating elements 932, 934, 936, and 938 are arranged such that the first end 933 of a first of the at least two of the plurality of resistive heating elements 932, 934, 936, and 938 is positioned proximate an interior edge of the bend in a second of the at least two of the plurality of resistive heating elements 932, 934, 936, and 938.

The plurality of resistive heating elements 932, 934, 936, and 938 may, for example, comprise a resistive heater element fabricated from tungsten, nickel-chromium alloy, aluminum-iron alloy, aluminum nitride, etc. Examples of commercially available materials to fabricate resistive heating elements include Kanthal, Nikrothal, Akrothal, which are registered trademark names for metal alloys produced by Kanthal Corporation of Bethel, Conn. The Kanthal family includes ferritic alloys (FeCrAl) and the Nikrothal family includes austenitic alloys (NiCr, NiCrFe). According to one example, each of the plurality of resistive heating elements 932, 934, 936, and 938 may comprise a Watlow FIREBAR® heating element, commercially available from Watlow Electric Manufacturing Company (12001 Lackland Road, St. Louis, Mo. 63146). Alternatively, or in addition, cooling elements can be employed in any of the embodiments.

As described above, the upper assembly 920 further comprises a power source configured to couple electrical power to the plurality of resistive heating elements 932, 934, 936, and 938. The power source may comprise a direct current (DC) power source or an alternating current (AC) power source. The plurality of resistive heating elements 932, 934, 936, and 938 may be connected in series or connected in parallel. Additionally, a temperature sensor 960 may be coupled to the gas injection assembly 950 and configured to measure a temperature of the gas injection assembly 950. The temperature sensor 960 may comprise a thermocouple (e.g. a K-type thermocouple, Pt sensor, etc.). A controller may be coupled to the heater assembly 930 and the temperature sensor 960, and configured to perform at least one of monitoring, adjusting, or controlling said temperature of the gas injection assembly 950. For example, at least one of a voltage, a current, a power, etc. may be adjusted in order to affect a change in the temperature of the gas injection assembly 950 and/or the upper assembly 920. Further yet, a plurality of temperature sensors may be utilized to monitor, adjust, and/or control a temperature distribution for the gas injection assembly 950 and/or the upper assembly 920.

Referring again to FIG. 5, chemical treatment system 500 may further comprise a temperature-controlled chemical treatment chamber 510 that is maintained at an elevated temperature. For example, a wall heating element (not shown) may be coupled to a wall temperature control unit (not shown), and the wall heating element may be configured to be coupled to the chemical treatment chamber 510. The heating element can, for example, comprise a resistive heater element such as a tungsten, nickel-chromium alloy, aluminum-iron alloy, aluminum nitride, etc., filament. Examples of commercially available materials to fabricate resistive heating elements include Kanthal, Nikrothal, Akrothal, which are registered trademark names for metal alloys produced by Kanthal Corporation of Bethel, Conn. The Kanthal family includes ferritic alloys (FeCrAl) and the Nikrothal family includes austenitic alloys (NiCr, NiCrFe). When an electrical current flows through the filament, power is dissipated as heat, and, therefore the wall temperature control unit may, for example, comprise a controllable DC power supply. For example, wall heating element can comprise at least one FIREROD® cartridge heater commercially available from Watlow Electric Manufacturing Company (12001 Lackland Road, St. Louis, Mo. 63146). A cooling element can also be employed in chemical treatment chamber 510. The temperature of the chemical treatment chamber 510 can be monitored using a temperature-sensing device such as a thermocouple (e.g. a K-type thermocouple, Pt sensor, etc.). Furthermore, a controller can utilize the temperature measurement as feedback to the wall temperature control unit in order to control the temperature of the chemical treatment chamber 510.

Referring still to FIG. 5, vacuum pumping system 580 can comprise a vacuum pump and a gate valve for throttling the chamber pressure. The vacuum pump can, for example, include a turbo-molecular vacuum pump (TMP) capable of a pumping speed up to about 5000 liters per second (and greater). For example, the TMP can be a Seiko STP-A803 vacuum pump, or an Ebara ET1301W vacuum pump. TMPs are useful for low pressure processing, typically less than about 50 mTorr. For high pressure (i.e., greater than about 100 mTorr) or low throughput processing (i.e., no gas flow), a mechanical booster pump and dry roughing pump can be used.

Referring still to FIG. 5, chemical treatment system 500 can further comprise a control system 590 having a microprocessor, memory, and a digital I/O port capable of generating control voltages sufficient to communicate and activate inputs to chemical treatment system 500 as well as monitor outputs from chemical treatment system 500 such as temperature and pressure sensing devices. Moreover, control system 590 can be coupled to and can exchange information with chemical treatment chamber 510, temperature-controlled substrate holder 540, upper assembly 520, heater assembly 530, gas injection assembly 550, vacuum pumping system 580, substrate holder temperature control system 560, lift-pin assembly 570, and gate valve assembly 518. For example, a program stored in the memory can be utilized to activate the inputs to the aforementioned components of chemical treatment system 500 according to a process recipe.

Control system 590 may be locally located relative to the chemical treatment system 500, or it may be remotely located relative to the chemical treatment system 500 via an internet or intranet. Thus, control system 590 can exchange data with the chemical treatment system 500 using at least one of a direct connection, an intranet, or the internet. Control system 590 may be coupled to an intranet at a customer site (i.e., a device maker, etc.), or coupled to an intranet at a vendor site (i.e., an equipment manufacturer). Furthermore, another computer (i.e., controller, server, etc.) can access control system 590 to exchange data via at least one of a direct connection, an intranet, or the internet.

As illustrated in FIG. 11A, the thermal treatment system 1000 further comprises a substrate holder 1040 mounted within the thermal treatment chamber 1010 and configured to support two or more substrates 1045 on a support surface thereof, an upper assembly 1020 coupled to an upper section of the thermal treatment chamber 1010, and a vacuum pumping system 1080 coupled to the thermal treatment chamber 1010 to evacuate the thermal treatment chamber 1010.

Substrate holder 1040 comprises a temperature-controlled substrate holder having one or more pedestals 1042 configured to support two or more substrates 1045. The one or more pedestals 1042 may be thermally insulated from the thermal treatment chamber 1010 using a thermal barrier 1044 and insulation member 1046. For example, the one or more pedestals 1042 may be fabricated from aluminum, stainless steel, or nickel, and the insulation member 1046 may be fabricated from a thermal insulator such as Teflon, alumina, or quartz. Furthermore, the one or more pedestals 1042 may be coated with a protective barrier to reduce contamination of the two or more substrates 1045. For example, the coating applied to part or all of the one or more pedestals 1042 may include a vapor-deposited material, such as silicon.

The substrate holder 1040 further comprises one or more heating elements embedded therein and a substrate holder temperature control unit 1060 coupled thereto. The heating element can, for example, comprise a resistive heater element such as a tungsten, nickel-chromium alloy, aluminum-iron alloy, aluminum nitride, etc., filament. Examples of commercially available materials to fabricate resistive heating elements include Kanthal, Nikrothal, and Akrothal, which are registered trademark names for metal alloys produced by Kanthal Corporation of Bethel, Conn. The Kanthal family includes ferritic alloys (FeCrAl) and the Nikrothal family includes austenitic alloys (NiCr, NiCrFe). When an electrical current flows through the filament, power is dissipated as heat, and, therefore, the substrate holder temperature control unit 1060 can, for example, comprise a controllable DC power supply. Alternately, the temperature-controlled substrate holder 1040 may, for example, be a cast-in heater commercially available from Watlow Electric Manufacturing Company (12001 Lackland Road, St. Louis, Mo. 63146) capable of a maximum operating temperature of about 400 to about 450 degrees C., or a film heater comprising aluminum nitride materials that is also commercially available from Watlow and capable of operating temperatures as high as about 300 degrees C. and power densities of up to about 23.25 W/cm$^2$. Alternatively, a cooling element can be incorporated in substrate holder 1040.

The temperature of the substrate holder 1040 may be monitored using a temperature-sensing device such as a thermocouple (e.g. a K-type thermocouple). Furthermore, a controller can utilize the temperature measurement as feedback to the substrate holder temperature control unit 1060 in order to control the temperature of the substrate holder 1040.

Additionally, the substrate temperature can be monitored using a temperature-sensing device such as an optical fiber thermometer commercially available from Advanced Energies, Inc. (1625 Sharp Point Drive, Fort Collins, Colo., 80525), Model No. OR2000F capable of measurements from about 50 degrees to about 2000 degrees C. and an accuracy of about plus or minus 1.5 degrees C., or a band-edge temperature measurement system as described in pending U.S. patent application Ser. No. 10/168544, filed on Jul. 2, 2002, the contents of which are incorporated herein by reference in their entirety.

Referring still to FIG. 11A, thermal treatment chamber 1010 is temperature-controlled and maintained at a selected temperature. For example, a thermal wall heating element (not shown) may be coupled to a thermal wall temperature control unit (not shown), and the thermal wall heating element (not shown) may be configured to couple to the thermal treatment chamber 1010. The heating element may, for example, comprise a resistive heater element such as a tungsten, nickel-chromium alloy, aluminum-iron alloy, aluminum nitride, etc., filament. Examples of commercially available materials to fabricate resistive heating elements include Kanthal, Nikrothal, Akrothal, which are registered trademark names for metal alloys produced by Kanthal Corporation of Bethel, Conn. The Kanthal family includes ferritic alloys (FeCrAl) and the Nikrothal family includes austenitic alloys (NiCr, NiCrFe). When an electrical current flows through the filament, power is dissipated as heat, and, therefore, the thermal wall temperature control unit can, for example, comprise a controllable DC power supply. For example, thermal wall heating element can comprise at least one FIREROD® cartridge heater commercially available from Watlow (1310 Kingsland Dr., Batavia, Ill., 60510). Alternatively, or in addition, cooling elements may be employed in thermal treatment chamber 1010. The temperature of the thermal treatment chamber 1010 may be monitored using a temperature-sensing device such as a thermocouple (e.g. a K-type thermocouple, Pt sensor, etc.). Furthermore, a controller can utilize the temperature measurement as feedback to the thermal wall temperature control unit in order to control a temperature of the thermal treatment chamber 1010.

Referring still to FIG. 11A, thermal treatment system 1000 further comprises upper assembly 1020. The upper assembly 1020 can, for example, comprise a gas injection system 1050 for introducing a purge gas, process gas, or cleaning gas to a process space 1012 in the thermal treatment chamber 1010. Alternately, thermal treatment chamber 1010 may comprise a gas injection system separate from the upper assembly. For example, a purge gas, process gas, or cleaning gas can be introduced to the thermal treatment chamber 1010 through a side-wall thereof. It can further comprise a cover or lid having at least one hinge, a handle, and a clasp for latching the lid in a closed position. In an alternate embodiment, the upper assembly 1020 can comprise a radiant heater such as an array of tungsten halogen lamps for heating substrates 1045' resting atop blades 1074, 1074' (see FIG. 12) of substrate lifter assembly 1070. In this case, the substrate holder 1040 may be excluded from the thermal treatment chamber 1010.

Referring still to FIG. 11A, the upper assembly 1020 is temperature-controlled and maintained at a selected temperature. For example, upper assembly 1020 may be coupled to an upper assembly temperature control unit (not shown), and the upper assembly heating element (not shown) may be configured to be couple to the upper assembly 1020. The heating element can, for example, comprise a resistive heater element such as a tungsten, nickel-chromium alloy, aluminum-iron alloy, aluminum nitride, etc., filament. Examples of commercially available materials to fabricate resistive heating elements include Kanthal, Nikrothal, Akrothal, which are registered trademark names for metal alloys produced by Kanthal Corporation of Bethel, Conn. The Kanthal family includes ferritic alloys (FeCrAl) and the Nikrothal family includes austenitic alloys (NiCr, NiCrFe). When an electrical current flows through the filament, power is dissipated as heat, and, therefore, the upper assembly temperature control unit may, for example, comprise a controllable DC power supply. For example, upper assembly heating element can comprise a dual-zone silicone rubber heater (about 1.0 mm thick) capable of about 1400 W (or power density of about 5 W/in$^2$). The temperature of the upper assembly 1020 may be monitored using a temperature-sensing device such as a thermocouple (e.g. a K-type thermocouple, Pt sensor, etc.). Furthermore, a controller can utilize the temperature measurement as feedback to the upper assembly temperature control unit in order to control the temperature of the upper assembly 1020. Upper assembly 1020 may additionally or alternatively include a cooling element.

Figure 12:
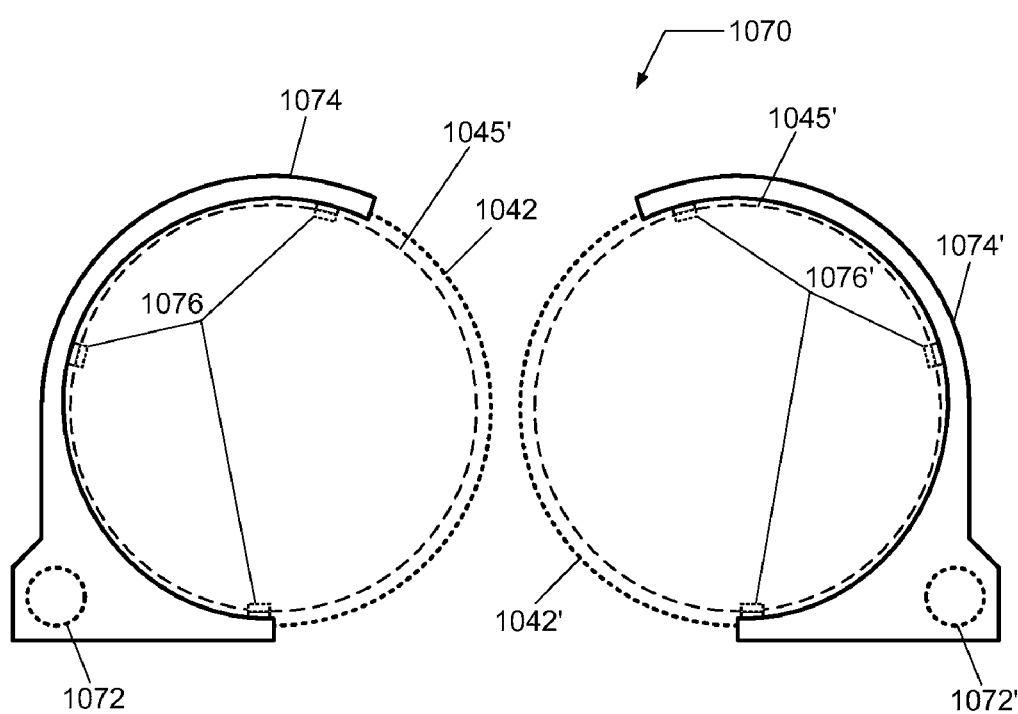
FIG. 12 provides a top view of a substrate lifting assembly according to an embodiment.

Referring now to FIGS. 11A, 11B and 12, thermal treatment system 1000 further comprises a substrate lifter assembly 1070. The substrate lifter assembly 1070 is configured to lower substrates 1045 to an upper surface of the pedestals 1042, 1042', as well as raise substrates 1045' from an upper surface of the pedestals 1042, 1042' to a holding plane, or a transfer plane there between. At the transfer plane, substrates 1045' can be exchanged with a transfer system utilized to transfer substrates into and out of the chemical and thermal treatment chambers 510, 1010. At the holding plane, substrates 1045' can be cooled while another pair of substrates is exchanged between the transfer system and the chemical and thermal treatment chambers 510, 1010. As shown in FIG. 12, the substrate lifter assembly 1070 comprises a pair of blades 1074, 1074', each having three or more tabs 1076, 1076' for receiving substrates 1045'. Additionally, the blades 1074, 1074' are coupled to drive arms 1072, 1072' for coupling the substrate lifter assembly 1070 to the thermal treatment chamber 1010, wherein each drive arm 1072, 1072' is driven by drive systems 1078 for permitting vertical translation of the blades 107, 107' within the thermal treatment chamber 1010. The tabs 1076, 1076' are configured to grasp substrates 1045' in a raised position, and to recess within receiving cavities 1077 formed within the pedestals 1042, 1042' when in a lowered position. The drive systems 1078 can, for example, include pneumatic drive systems designed to meet various specifications including cylinder stroke length, cylinder stroke speed, position accuracy, non-rotation accuracy, etc., the design of which is known to those skilled in the art of pneumatic drive system design.

Figure 13:
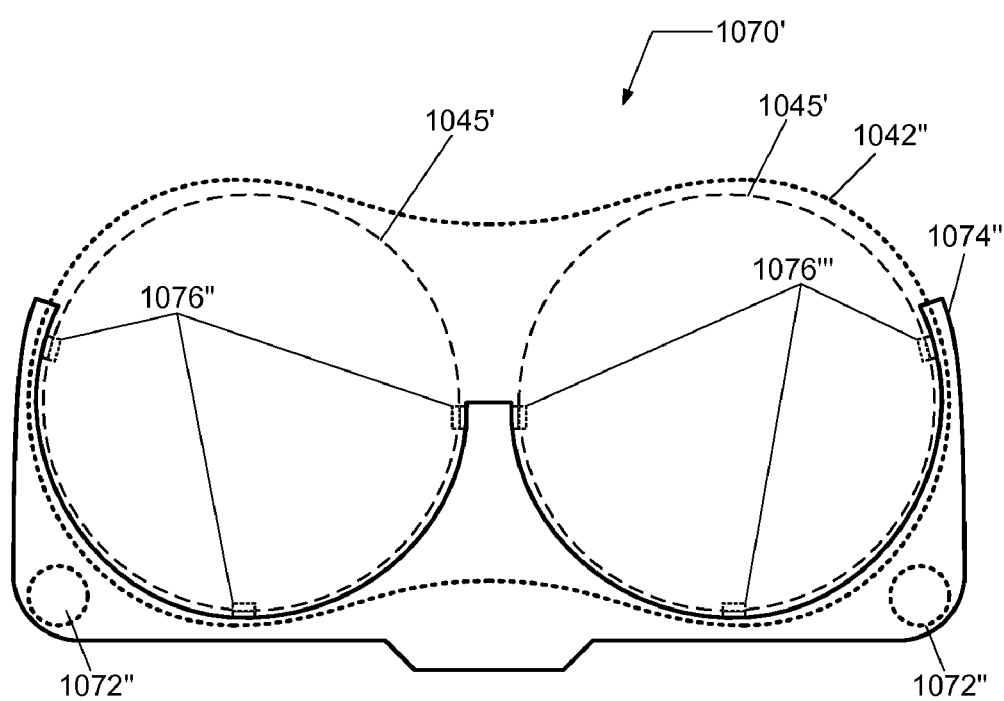
FIG. 13 provides a top view of a substrate lifting assembly according to another embodiment.

Alternatively, as shown in FIGS. 11A, 11B and 13, thermal treatment system 1000 further comprises a substrate lifter assembly 1070'. The substrate lifter assembly 1070' is configured to lower and raise substrates 1045' to and from the upper surface of contiguous pedestal 1042", as well as raise a substrate 1045' from an upper surface of the pedestal 1042" to a holding plane, or a transfer plane there between. At the transfer plane, substrates 1045' can be exchanged with a transfer system utilized to transfer substrates into and out of the chemical and thermal treatment chambers 510, 1010. At the holding plane, substrates 1045' may be cooled while another pair of substrates is exchanged between the transfer system and the chemical and thermal treatment chambers 510, 1010. As shown in FIG. 13, the substrate lifter assembly 1070' comprises a single blade 1074" having two sets of three or more tabs 1076", 1076'" for receiving substrates 1045'. Additionally, the single blade 1074" is coupled to drive arms 1072'" for coupling the substrate lifter assembly 1070' to the thermal treatment chamber 1010, wherein drive arms 1072" are driven by a drive system 1078, as described above, for permitting vertical translation of the blade 1074" within the thermal treatment chamber 1010. The tabs 1076", 1076'" are configured to grasp substrates 1045' in a raised position, and to recess within receiving cavities formed within the pedestal 1042" when in a lowered position. The drive system 1078 can, for example, include pneumatic drive systems designed to meet various specifications including cylinder stroke length, cylinder stroke speed, position accuracy, non-rotation accuracy, etc., the design of which is known to those skilled in the art of pneumatic drive system design.

Additionally, as shown in FIG. 11A, the thermal treatment system 1000 further comprises a substrate detection system comprising one or more detectors 1022 in order to identify whether substrates are located in the holding plane. The substrate detection system can gain optical access through one or more optical windows 1024. The substrate detection system may, for example, comprise a Keyence digital laser sensor.

Referring still to FIG. 11A, thermal treatment system 1000 further comprises vacuum pumping system 1080. Vacuum pumping system 1080 can, for example, comprise a vacuum pump, and a throttle valve such as a gate valve or butterfly valve. The vacuum pump can, for example, include a turbo-molecular vacuum pump (TMP) capable of a pumping speed up to about 5000 liters per second (and greater). TMPs are useful for low pressure processing, typically less than about 50 mTorr. For high pressure processing (i.e., greater than about 100 mTorr), a mechanical booster pump and dry roughing pump can be used.

Referring still to FIG. 11A, thermal treatment system 1000 can further comprise a control system 1090 having a microprocessor, memory, and a digital I/O port capable of generating control voltages sufficient to communicate and activate inputs to thermal treatment system 1000 as well as monitor outputs from thermal treatment system 1000. Moreover, control system 1090 can be coupled to and can exchange information with substrate holder temperature control unit 1060, upper assembly 1020, gas injection system 1050, the substrate detection system, vacuum pumping system 1080, and substrate lifter assembly 1070. For example, a program stored in the memory can be utilized to activate the inputs to the aforementioned components of thermal treatment system 1000 according to a process recipe.

Control system 1090 may be locally located relative to the thermal treatment system 1000, or it may be remotely located relative to the thermal treatment system 1000 via an internet or intranet. Thus, control system 1090 can exchange data with the thermal treatment system 1000 using at least one of a direct connection, an intranet, or the internet. Control system 1090 may be coupled to an intranet at a customer site (i.e., a device maker, etc.), or coupled to an intranet at a vendor site (i.e., an equipment manufacturer). Furthermore, another computer (i.e., controller, server, etc.) can access control system 1090 to exchange data via at least one of a direct connection, an intranet, or the internet.

In an alternate embodiment, control system 590 and control system 1090 may be the same control system.

Figure 14:
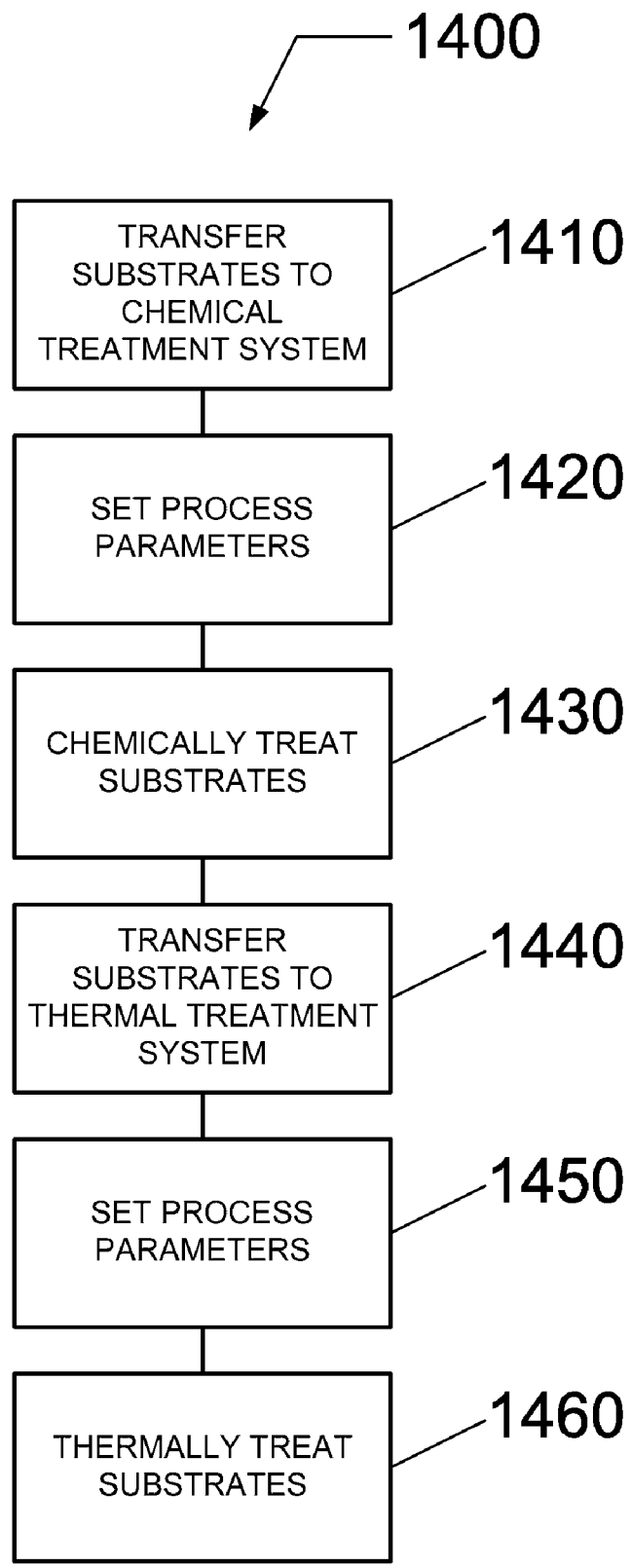
FIG. 14 provides a method of operating a chemical treatment system and a thermal treatment system according to an embodiment.

FIG. 14 presents a method of operating a processing platform comprising a chemical treatment system and a thermal treatment system. The method is illustrated as a flowchart 1400 beginning with step 1410 wherein a plurality of substrates are transferred to the chemical treatment system using the substrate transfer system. The substrates are received by lift pins that are housed within one or more substrate holders, and the substrates are lowered to the one or more substrate holders. Thereafter, the substrates may rest on the one or more substrate holders for processing. Alternatively, the substrates may be secured to the one or more substrate holders using a clamping system, such as an electrostatic clamping system, and a heat transfer gas is supplied to the backside of the substrates.

In step 1420, one or more process parameters for chemical treatment of the substrates are set. For example, the one or more chemical processing parameters comprise at least one of a chemical treatment processing pressure, a chemical treatment wall temperature, a chemical treatment substrate holder temperature, a chemical treatment substrate temperature, a chemical treatment gas distribution system temperature, and a chemical treatment gas flow rate. For example, one or more of the following may occur: 1) a controller coupled to a wall temperature control unit and a first temperature-sensing device is utilized to set a chemical treatment chamber temperature for the chemical treatment chamber; 2) a controller coupled to a gas distribution system temperature control unit and a second temperature-sensing device is utilized to set a chemical treatment gas distribution system temperature for the chemical treatment chamber; 3) a controller coupled to at least one temperature control element and a third temperature-sensing device is utilized to set a chemical treatment substrate holder temperature; 4) a controller coupled to at least one of a temperature control element, a backside gas supply system, and a clamping system, and a fourth temperature sensing device in the substrate holder is utilized to set a chemical treatment substrate temperature; 5) a controller coupled to at least one of a vacuum pumping system, and a gas distribution system, and a pressure-sensing device is utilized to set a processing pressure within the chemical treatment chamber; and/or 6) the mass flow rates of the one or more process gases are set by a controller coupled to the one or more mass flow controllers within the gas distribution system.

In step 1430, the substrates are chemically treated under the conditions set forth in step 1420 for a first period of time. The first period of time can range from about 10 to about 480 seconds, for example.

In step 1440, the substrates are transferred from the chemical treatment system to the thermal treatment system. During which time, the optional substrate clamp is removed, and the optional flow of heat transfer gas to the backside of the substrates is terminated. The substrates are vertically lifted from the one or more substrate holders to the transfer plane using a lift pin assembly. The transfer system receives the substrates from the lift pins and positions the substrates within the thermal treatment system. Therein, the substrate lifter assembly receives the substrates from the transfer system, and lowers the substrates to the substrate holder.

In step 1450, one or more thermal process parameters for thermal treatment of the substrates are set. For example, the one or more thermal processing parameters comprise at least one of a thermal treatment wall temperature, a thermal treatment upper assembly temperature, a thermal treatment substrate temperature, a thermal treatment substrate holder temperature, a thermal treatment substrate temperature, and a thermal treatment processing pressure. For example, one or more of the following may occur: 1) a controller coupled to a thermal wall temperature control unit and a first temperature-sensing device in the thermal treatment chamber is utilized to set a thermal treatment wall temperature; 2) a controller coupled to an upper assembly temperature control unit and a second temperature-sensing device in the upper assembly is utilized to set a thermal treatment upper assembly temperature; 3) a controller coupled to a substrate holder temperature control unit and a third temperature-sensing device in the heated substrate holder is utilized to set a thermal treatment substrate holder temperature; 4) a controller coupled to a substrate holder temperature control unit and a fourth temperature-sensing device in the heated substrate holder and coupled to the substrate is utilized to set a thermal treatment substrate temperature; and/or 5) a controller coupled to a vacuum pumping system, a gas distribution system, and a pressure sensing device is utilized to set a thermal treatment processing pressure within the thermal treatment chamber.

In step 1460, the substrate is thermally treated under the conditions set forth in step 1450 for a second period of time. The second period of time can range from 10 to 480 seconds, for example.

In an example, the processing platform, as depicted in FIGS. 1 through 4, including the chemical treatment system of FIG. 5 and the thermal treatment system of FIGS. 11A and 11B, may be configured to perform a dry, non-plasma etching process or a dry, non-plasma cleaning process. For example, the process may be used to trim a mask layer, or remove residue and other contaminants from surfaces of a substrate. Furthermore, for example, the process may include a chemical oxide removal process.

The processing platform comprises a chemical treatment system for chemically treating exposed surface layers, such as oxide surface layers, on a substrate, whereby adsorption of the process chemistry on the exposed surfaces affects chemical alteration of the surface layers. Additionally, the processing platform comprises thermal treatment system for thermally treating the substrate, whereby the substrate temperature is elevated in order to desorb (or evaporate) the chemically altered exposed surface layers on the substrate.

In the chemical treatment system, the process space may be operated at above-atmosphere, at atmospheric, or under reduced-pressure conditions. In the following example, the process space is operated under reduced-pressure conditions. A process gas comprising HF and optionally $NH_3$ is introduced. Alternately, the process gas can further comprise a carrier gas. The carrier gas can, for example, comprise an inert gas such as argon, xenon, helium, etc. The processing pressure may range from about 1 to about 1000 mTorr. Alternatively, the processing pressure can range from about 10 to about 500 mTorr. The process gas flow rates may range from about 1 to about 10000 sccm for each gas specie. Alternatively, the flow rates can range from about 10 to about 500 sccm.

Additionally, the chemical treatment chamber can be heated to a temperature ranging from about 10 degrees C. to about 200 degrees C. Alternatively, the chamber temperature can range from about 30 degrees C. to about 100 degrees C. Additionally, the gas distribution system can be heated to a temperature ranging from about 10 degrees C. to about 200 degrees C. Alternatively, the gas distribution system temperature can range from about 30 degrees C. to about 100 degrees C. The substrate can be maintained at a temperature ranging from about 10 degrees C. to about 80 degrees C. Alternatively, the substrate temperature can range form about 25 degrees C. to about 60 degrees C.

In the thermal treatment system, the thermal treatment chamber can be heated to a temperature ranging from about 20 degrees C. to about 200 degrees C. Alternatively, the chamber temperature can range from about 100 degrees C. to about 150 degrees C. Additionally, the upper assembly can be heated to a temperature ranging from about 20 degrees C. to about 200 degrees C. Alternatively, the upper assembly temperature can range from about 100 degrees C. to about 150 degrees C. The substrate holder can be heated to a temperature in excess of about 100 degrees C., for example, from about 100 degrees C. to about 200 degrees C. The substrate can be heated to a temperature in excess of about 100 degrees C., for example, from about 100 degrees C. to about 200 degrees C.

According to another embodiment, one or more surfaces of the components comprising the chemical treatment chamber 510 (FIG. 5) and the thermal treatment chamber 1010 (FIGS. 11A and 11B) can be coated with a protective barrier. The protective barrier may comprise a ceramic coating, a plastic coating, a polymeric coating, a vapor deposited coating, etc. For example, the protective barrier may comprise polyimide (e.g., Kapton®), polytetrafluoroethylene resin (e.g., Teflon® PTFE), polyfluoroalkoxy (PFA) copolymer resin (e.g., Teflon® PFA), fluorinated ethylene propylene resin (e.g., Teflon® FEP), a surface anodization layer, a ceramic spray coating (such as alumina, yttria, etc.), a plasma electrolytic oxidation layer, etc.

Figure 15:
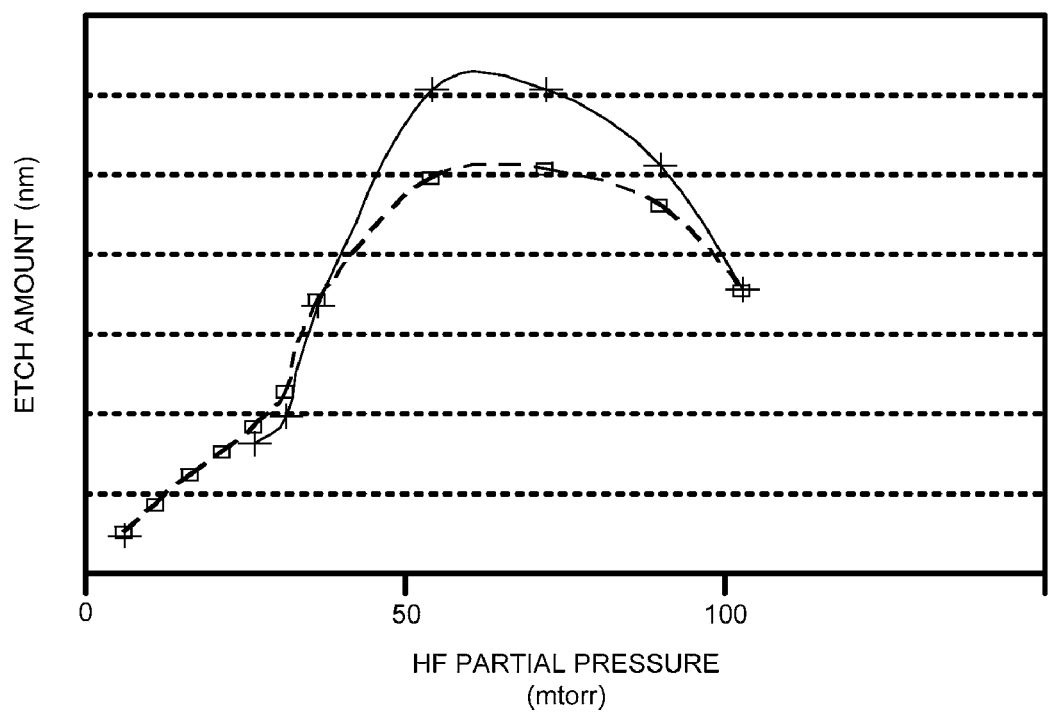
FIG. 15 provides exemplary data for an etch rate using a dry, non-plasma process.

Referring now to FIG. 15, a chemical oxide removal process is performed, wherein a process gas comprising HF and $NH_3$ is introduced to a chemical treatment system for chemically altering the surface layers of a $SiO_2$ film. Thereafter, the chemically modified surface layers of the $SiO_2$ film are removed in a thermal treatment system. As shown in FIG. 15, an etch amount (nm) of the $SiO_2$ film is provided as a function of HF partial pressure (mtorr) for a given set of process conditions (i.e., pressure, temperature, etc). For a first set of data (dashed line, open squares), the surfaces exposed to the chemical process in the chemical treatment system comprise bare aluminum. For a second set of data (solid line, crosses) using the same process conditions as the first set of data, one or more surfaces exposed to the chemical process in the chemical treatment system comprise a coating containing PTFE applied thereto. In this example, the PTFE is applied to the underside of the substrate holder in the chemical treatment system. As depicted in FIG. 15, the application of a coating to one or more bare aluminum surfaces exposed to the chemical process causes an increase in the etch amount. It is suspected that the coating reduces gettering of the HF reactant and, hence, reduces the amount of HF consumed by exposed aluminum surfaces in the formation of $NH_4F$ on these surfaces.

Figure 16:
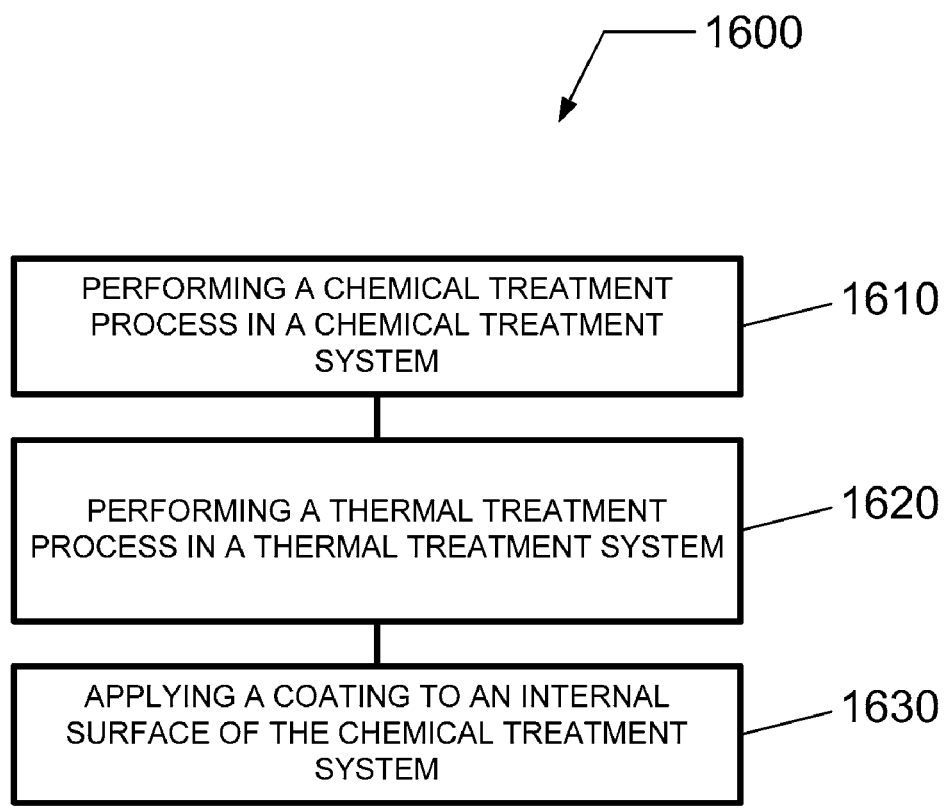
FIG. 16 provides a method of etching a substrate using a dry, non-plasma etching process according to an embodiment.

Referring to FIG. 16, a method of increasing a dry, non-plasma etch rate is provided according to an embodiment. The method is illustrated as a flowchart 1600 beginning in step 1610 with performing a chemical treatment process in a chemical treatment system. The chemical treatment process may comprise a dry, non-plasma chemical oxide removal process, wherein one or more substrates are exposed to a gaseous environment containing HF and optionally $NH_3$. The gaseous environment may further comprise a diluent, such as a noble gas.

In 1620, a thermal treatment process is performed in a thermal treatment system. The thermal treatment process may include elevating a temperature of the one or more substrates to remove the surface layers chemically modified in the chemical treatment process.

In 1630, a coating is applied to one or more surfaces in the chemical treatment chamber to increase the etch amount achieved for each set of chemical treatment process and thermal treatment process steps. The coating may include any one of the materials described above. The coating may prevent or reduce the sorption of ammonium fluoride ($NH_4F$) onto internal surfaces of the chemical treatment system. The internal surfaces of the chemical treatment system may include the chemical treatment chamber, the temperature-controlled substrate holder, or the gas injection assembly, or any combination thereof.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A processing system for chemically treating a plurality of substrates, comprising:
   a chemical treatment chamber;
   a temperature controlled substrate holder mounted within said chemical treatment chamber and configured to support two or more substrates arranged substantially coplanar with one another on a support surface thereof in a single process space, wherein said support surface Of said temperature controlled substrate holder is configured to receive said two or more substrates simultaneously;
   a gas injection assembly coupled to said chemical treatment chamber and configured to introduce one or more process gases to said single process space in said chemical treatment chamber in order to chemically alter exposed surface layers on said two or more substrates;
   a heater assembly coupled to said gas injection assembly and configured to elevate a temperature of said gas injection assembly;
   a vacuum pumping system coupled to said chemical treatment chamber; and
   a dedicated substrate handler configured to simultaneously transfer said two or more substrates arranged substantially coplanar with one another into said chemical treatment chamber when loading said two or more substrates onto said temperature-controlled substrate holder and out of said chemical treatment chamber when unloading said two or more substrates from said temperature-controlled substrate holder.

2. The processing system of claim 1, wherein said gas injection assembly comprises a temperature controlled portion exposed to said one or more process gases in said chemical treatment chamber.

3. The processing system of claim 1, wherein a temperature of said chemical treatment chamber is controlled.

4. The processing system of claim 1, wherein said chemical treatment chamber is coupled to another processing system.

5. The processing system of claim 1, wherein said chemical treatment chamber is coupled to at least one of a thermal treatment system and a substrate rinsing system.

6. The processing system of claim 1, wherein said one or more process gases comprise a first process gas and a second process gas, and wherein said gas injection assembly is configured to introduce said first process gas into said process space independent of said second process gas.

7. The processing system of claim 6, wherein said gas injection assembly comprises a first gas distribution plenum and a first gas distribution plate having a first array of one or more orifices and a second array of one or more orifices for coupling said first process gas to said process space through said first array of one or more orifices in said first gas distribution plate, and a second gas distribution plenum and a second gas distribution plate having passages therein for coupling said second process gas to said process space through said passages in said second gas distribution plate and said second array of one or more orifices in said first gas distribution plate.

8. The processing system of claim 6, wherein said gas injection assembly comprises a gas distribution surface located at an exit plane of a plurality or gas distribution orifices that extends above at least two of said two or more substrates, and wherein said gas injection assembly is configured to distribute said first process gas and said second process gas through said gas distribution surface immediately above said at least two of said two or more substrates.

9. The processing system of claim 1, wherein said first process gas comprises HF and said second process gas comprises $NI_3$.

10. The processing system of claim 1, wherein said temperature controlled substrate holder comprises:
    a temperature-controlled substrate table having said support surface configured to support said two or more substrates, a lower surface opposite said support surface, and an edge surface;
    a fluid channel formed within an interior of said temperature-controlled substrate table; and
    two or more support columns configured to support said temperature-controlled substrate table at a distance from a wall of said chemical treatment chamber, wherein each of said two or more support columns comprises a first cad coupled to said lower surface or said temperature-controlled substrate table and a second end coupled to said wall of said chemical treatment chamber, and wherein each of said two or more support columns comprises an external surface exposed to said one or more process gases in said single process space.

11. The processing system of claim 10, wherein said temperature controlled substrate holder thither comprises:
    a fluid thermal unit constructed and arranged to control a temperature of a heat transfer fluid;
    a first fluid conduit formed through one of said two or more support columns, said first fluid conduit configured to receive said heat transfer fluid from said fluid thermal unit and supply said heat transfer fluid to an inlet end of said fluid channel; and
    a second fluid conduit formed through another of said two or more support columns, said second fluid conduit configured to receive said heat transfer fluid from an outlet end of said fluid channel.

12. The processing system of claim 11, wherein said temperature controlled substrate holder further comprises:
    a controller coupled to said fluid thermal unit and configured to perform at least one of monitoring, adjusting, or controlling said temperature of said heat transfer fluid; and
    a temperature sensor coupled to said temperature-controlled substrate table and configured to measure a substrate holder temperature,
    wherein said controller compares said substrate holder temperature to as target substrate holder temperature, and wherein said controller adjusts said temperature of said heat transfer fluid, or a flow rate of said heat transfer fluid, or a combination thereof to reduce a difference between said substrate holder temperature and said target substrate holder temperature.

13. The processing system of claim 10, wherein said temperature controlled substrate holder further comprises:
    a first array of three lift pin holes configured to allow a first array of lift pins to pass through said temperature-controlled substrate table to lift A first substrate to and from said support surface of said temperature-controlled substrate table; and a second array of three lift pin holes configured to allow a second array of lift pins to pass through said temperature-controlled substrate table to lift a second substrate to and from said support surface of said temperature-controlled substrate table.

14. The processing system of claim 13, wherein said temperature controlled substrate holder Further comprises:

a lift pin support member; and a drive system coupled to said chemical treatment chamber, and configured to translate said H ft pin support member such that said first array of lift pins translate through said first array of lift pin holes and said second array of lift pins translate through said second array of lift pin holes, wherein said first array of lift pins is configured to align and pass through said first array of lift pin holes, each lift pin in said first array of lilt pins comprises a first contact end configured to contact said first substrate and a first support end coupled to said Hit pin support member, and wherein said second array of lift pins is configured to align and pass through said second array of lift pin holes, each lift pin in said second array of lift pins comprises a second contact end configured to contact said second substrate and a second support end coupled to said lift pin support member.

15. The processing system of claim 1, wherein said heater assembly comprises:

a plate member having an upper surface; and a plurality of resistive heating elements coupled to said upper surface of said plate member, wherein each of said plurality of resistive heating elements comprises a first end fixedly coupled to said upper surface of said plate member, a second end configured to be coupled to a power source, a bend located between said first end and said second end, a first straight section extending between said first end and said bend, and a second straight section extending between said second end and said bend, and wherein at least two of said plurality of resistive heating elements are arranged such that said first end of a first of said at least two of said plurality of resistive heating elements is positioned proximate an interior edge of said bend in a second of said at least two of said plurality of resistive heating elements, and wherein said power source comprises a direct current (DC) power source or an alternating current (AC) power source.

16. The processing system of claim 1, wherein said chemical treatment chamber is configured to facilitate a non-plasma chemical process.

17. The processing system of claim 1, wherein said chemical treatment chamber is configured for use with a gaseous environment comprising HF and optionally $NH_3$.

18. The processing system of claim 1, wherein a coating is applied to at least a portion of said chemical treatment chamber, at least a portion of said temperature-controlled substrate holder, or at least a portion of said gas injection assembly, or any combination of two or more thereof.

19. The processing system of claim 1, wherein said coating comprises polytelrafluorocthylcnc.

20. The processing system of claim 1, wherein said coaling comprises a material that prevents or reduces the sorption of ammonium fluoride ($NH_4F$) onto surfaces of said chemical treatment chamber, said temperature controlled substrate holder, or said gas injection assembly, or any combination thereof to which said coating is applied.

* * * * *